(12) United States Patent
Sugaya et al.

(10) Patent No.: US 12,317,430 B2
(45) Date of Patent: May 27, 2025

(54) ELECTRICAL DEVICE

(71) Applicant: IRISO ELECTRONICS CO., LTD., Yokohama (JP)

(72) Inventors: Yujiro Sugaya, Yokohama (JP); Takanori Kimata, Yokohama (JP); Kazunari Kusaka, Yokohama (JP)

(73) Assignee: IRISO ELECTRONICS CO., LTD., Yokohama (JP)

( * ) Notice: Subject to any disclaimer, the term of this patent is extended or adjusted under 35 U.S.C. 154(b) by 95 days.

(21) Appl. No.: 18/160,382

(22) Filed: Jan. 27, 2023

(65) Prior Publication Data

US 2023/0247779 A1 Aug. 3, 2023

(30) Foreign Application Priority Data

Jan. 31, 2022 (JP) .................................. 2022-013743

(51) Int. Cl.
*H05K 5/00* (2025.01)
*H05K 1/18* (2006.01)
*H05K 5/02* (2006.01)

(52) U.S. Cl.
CPC ............... *H05K 5/02* (2013.01); *H05K 1/185* (2013.01); *H05K 5/0026* (2013.01); *H05K 2201/0129* (2013.01)

(58) Field of Classification Search
CPC .......... H05K 3/284; H05K 2203/1316; H05K 2201/0129; H05K 2201/10318; H05K 2201/1034; H05K 2203/1327; H05K 1/0284; H05K 1/18; H05K 1/181; H05K 1/185; H05K 5/0034; H05K 3/34; H05K 2201/0212; H05K 5/02; H05K 5/0026; H01L 2924/181; H01L 21/565; H01R 43/24; Y10T 29/49146; B29C 45/1671; B29C 2045/1673

See application file for complete search history.

(56) References Cited

U.S. PATENT DOCUMENTS

| | | | | |
|---|---|---|---|---|
| 5,650,663 A | * | 7/1997 | Parthasarathi | ...... H01L 23/4334 257/796 |
| 5,909,915 A | * | 6/1999 | Okuda | .................... H05K 5/064 29/841 |
| 5,920,119 A | * | 7/1999 | Tamba | .................. H01L 25/072 257/726 |

(Continued)

FOREIGN PATENT DOCUMENTS

| | | |
|---|---|---|
| JP | 2000216657 A | 8/2000 |
| JP | 2011100718 A | 5/2011 |

OTHER PUBLICATIONS

Electronic Device, WO2021/090785, Sugimoto et al., PE2E translation. (Year: 2021).*

*Primary Examiner* — Michael A Matey
(74) *Attorney, Agent, or Firm* — Westman, Champlin & Koehler, P.A.

(57) ABSTRACT

An electrical device includes a board, an electrical component bonded to the board by soldering, and a resin section that retains the board and the electrical component. The resin section is formed by insert molding with the board and the electrical component as inserts. A resin for configuring the resin section is a thermoplastic resin. A melting temperature of the resin for configuring the resin section is higher than a melting temperature of a solder for bonding the electrical component to the board.

6 Claims, 17 Drawing Sheets

(56) References Cited

U.S. PATENT DOCUMENTS

| | | | | |
|---|---|---|---|---|
| 5,946,556 A | * | 8/1999 | Hashizume | H01L 21/56 257/E23.128 |
| 6,905,349 B1 | * | 6/2005 | Brandenburg | H05K 3/284 439/79 |
| 8,770,988 B2 | | 7/2014 | Furukawa | |
| 2001/0002874 A1 | * | 6/2001 | Sakamoto | H01L 23/13 257/E23.125 |
| 2003/0012005 A1 | * | 1/2003 | Ito | H01L 21/56 361/752 |
| 2004/0053443 A1 | * | 3/2004 | Kumamoto | H01L 21/565 438/126 |
| 2004/0066693 A1 | * | 4/2004 | Osako | H01L 23/49855 257/E23.064 |
| 2004/0238940 A1 | * | 12/2004 | Ebine | H05K 3/3442 257/676 |
| 2005/0000726 A1 | * | 1/2005 | Kimata | H05K 3/284 29/841 |
| 2005/0029651 A1 | * | 2/2005 | Tomioka | H01L 23/36 438/455 |
| 2006/0250756 A1 | * | 11/2006 | Sugimoto | H05K 5/065 361/600 |
| 2006/0272150 A1 | * | 12/2006 | Eguchi | H05K 5/0082 29/841 |
| 2008/0251894 A1 | * | 10/2008 | Kojima | H01L 24/25 257/659 |
| 2012/0184142 A1 | * | 7/2012 | Furukawa | H01R 43/24 439/620.22 |
| 2015/0049450 A1 | * | 2/2015 | Okamoto | H01L 24/92 361/779 |
| 2017/0309576 A1 | * | 10/2017 | Kawabata | H01L 25/16 |
| 2020/0315026 A1 | * | 10/2020 | Muronoi | H05K 5/069 |
| 2020/0315027 A1 | * | 10/2020 | Muronoi | H01R 12/722 |
| 2021/0359481 A1 | * | 11/2021 | Hanninen et al. | H05K 3/284 |
| 2022/0246488 A1 | * | 8/2022 | Shibata | H01L 23/552 |
| 2023/0092720 A1 | * | 3/2023 | Yamashita | H01R 12/707 439/606 |

* cited by examiner

ELECTRICAL DEVICE

CROSS-REFERENCE TO RELATED APPLICATION

This application claims priority under 35 USC 119 from Japanese Patent application No. 2022-013743 filed on Jan. 31, 2022, the disclosure of which is incorporated by reference herein in its entirety.

TECHNICAL FIELD

The present disclosure relates to an electrical device and to a manufacturing method thereof.

BACKGROUND ART

An electrical device described in Patent Document 1 includes a board with electrical components bonded thereto by soldering, terminals bonded to the board by soldering or the like, and a resin section covering the board and terminals. The terminals are attached to the board in advance by soldering or the like when manufacturing such an electrical device, and then the resin section is formed by insert molding with the terminal-attached board as an insert.

RELATED ART

Related Patent Documents

Patent Document 1: Japanese Patent Application Laid-Open (JP-A) No. 2011-100718
Patent Document 2: JP-A No. 2000-216657

SUMMARY OF INVENTION

Technical Problem

A problem addressed by a first aspect of the present disclosure is to provide an electrical device having high productivity.

A problem addressed by a second aspect of the present disclosure is to provide an electrical device having high heat resistance and in which deterioration of electrical components is prevented.

Solution to Problem

An electrical device according to an aspect 1-1 is an electrical device including a board, a terminal connected to the board, and a resin section that retains the board and the terminal. The resin section is formed by insert molding with the board and the terminal as inserts, the connection of the terminal to the board is implemented by the resin section retaining the board and the terminal such that the terminal is maintained in a state of contact with the board, and no bonding material other than the resin for configuring the resin section is disposed at a connection location of the terminal to the board.

In this aspect the electrical device includes the board, the terminal connected to the board, and the resin section that retains the board and the terminal. The resin section is formed by insert molding with the board and the terminal as inserts, and so the electrical device has high water proofing, dust proofing, and anti-vibration characteristics.

The connection of the terminal to the board is implemented by the resin section retaining the board and the terminal such that the terminal is maintained in a state of contact to the board. There is no bonding material other than the resin for configuring the resin section (i.e. no solder, adhesive, or the like) disposed at the connection location of the terminal to the internal board.

The productivity is accordingly raised in the following manner.

Namely, hitherto in an electrical device, terminals are attached to a board by soldering in advance prior to forming a resin section by insert molding, and so sometimes the board and the terminals are difficult to dispose in the mold for insert molding due to misalignment of the attachment positions of the terminal with respect to the board, with this having an adverse effect on productivity.

In contrast thereto, in the electrical device according to the present aspect, there is no bonding material other than the resin for configuring the resin section disposed at the connection location of the terminal to the board, and so this enables omission of a process for attaching the terminal to the board using soldering or the like prior to forming the resin section. Omitting this process facilitates placement of the board and the terminal in the mold for insert molding, and productivity is raised as a result thereof.

Note that although in an exemplary embodiment described later an example is described in which the resin for configuring the resin section is a thermoplastic resin, and the melting temperature of the resin for configuring the resin section is higher than the melting temperature of the solder for bonding the electrical components to the board, the present aspect is not limited thereto.

Although in an exemplary embodiment described later an example is described in which the terminal is retained by the resin section in a resiliently deformed state, the present aspect is not limited thereto. Namely, the terminal does not necessarily include a resilient portion. In such cases preferably a site capable of undergoing resilient deformation is formed to the mold for use in insert molding, and this resiliently deformable site is pressed against the terminal or the board. This thereby enables variation (tolerance) in the thickness of the terminal and the board to be absorbed by resilient deformation of the mold in cases in which such variance has occurred.

Moreover, although in an exemplary embodiment described later an example is described in which there is no bonding material other than the resin for configuring the resin section disposed at the connection location of the terminal to the board for all of plural terminals, the present aspect is not limited thereto.

An electrical device according to an aspect 1-2 is the aspect 1-1, wherein the terminal includes a contact portion that contacts the board, the terminal is resiliently deformed, and the terminal is retained by the resin section in a state in which the contact portion is pressed against the board by recovery force to this resilient deformation.

In this aspect the terminal includes the contact portion that contacts the board. The terminal undergoes resilient deformation, and the terminal is retained by the resin section in a state in which the contact portion is pressed against the board by recovery force to this resilient deformation.

This thereby enables insert molding to be performed while a state in which the contact portion of the terminal is being pressed against the board by the recovery force to the resilient deformation of the terminal is still being maintained. This results in a good connection state between the terminal and the board in the finished product of the electrical device.

An electrical device according to an aspect 1-3 is the aspect 1-1, wherein the terminal includes a contact portion that contacts the board, and a press portion that is exposed from the resin section and can be pressed during insert molding, with the press portion being formed at a position that enables the contact portion to be pressed against the board by pressing of the press portion during insert molding.

In the present aspect the terminal includes the contact portion that contacts the board, and the press portion that is exposed from the resin section and can be pressed during insert molding. The press portion is formed at the position that enables the contact portion to be pressed against the board by the pressing of the press portion during insert molding.

This thereby enables insert molding to be performed while a state is still being maintained in which the contact portion of the terminal is being pressed against the board by the pressing of the press portion. This results in a good connection state between the terminal and the board in the finished product of the electrical device.

Note that in an exemplary embodiment described later an example is described in which the contact portion and the press portion are formed at positions distanced from each other, and a portion between the contact portion and the press portion undergoes resilient deformation due to being pressed by the press portion. However, the present aspect is not limited thereto, and the contact portion and the press portion may be formed at the same position as each other.

An electrical device according to an aspect 1-4 is the aspect 1-3, wherein the contact portion and the press portion are formed at positions distanced from each other, the portion between the contact portion and the press portion undergoes resilient deformation, and the terminal is retained by the resin section in a state in which the contact portion is pressed against the board by recovery force to the resilient deformation.

In the present aspect the contact portion and the press portion are formed at positions distanced from each other. The portion between the contact portion and the press portion undergoes resilient deformation, and the terminal is retained by the resin section in a state in which the contact portion is pressed against the board by recovery force to the resilient deformation.

There is accordingly no need to directly hold the contact portion in place during insert molding, enabling the contact portion to be pressed against the board with an appropriate force, and enabling damage to the contact portion or the board to be suppressed from occurring.

The electrical device according to an aspect 1-5 is any one of the aspect 1-1 to aspect 1-4, wherein the board and the resin section both have shapes elongated in the same direction, the terminal is disposed in the vicinity of an edge at a length direction one end side of the board, and a gate mark of the resin section is formed at a position at a length direction other end side of the resin section.

In the present aspect the board and the resin section both have shapes elongated in the same direction. The terminal is disposed in the vicinity of the length direction one end side edge of the board, and the gate mark of the resin section is formed at the position at the length direction other end side of the resin section.

This means that the terminal is disposed at a position distanced from the gate where molten resin is injected at high pressure, enabling unintentional deformation of the terminal by the molten resin (for example, deformation of the terminal such that the terminal comes away from the board) to be suppressed from occurring.

An electrical device according to an aspect 1-6 is any one of the aspect 1-1 to aspect 1-5, wherein the electrical device includes an impact portion impacted by the molten resin, and a gate mark of the resin section is formed at a position facing the impact portion.

In the present aspect the electrical device includes the impact portion impacted by the molten resin. The gate mark of the resin section is formed at the position facing the impact portion, and so the force of the molten resin injected at high pressure during insert molding is weakened by impacting the impact portion. This thereby enables the terminal to be suppressed from being pulled away from the board by the molten resin impacting the terminal at high force.

Note that although in an exemplary embodiment described later an example is described in which the impact portion is a housing of an internal connector attached to the board, the impact portion of the present aspect is not limited thereto.

An electrical device according to an aspect 1-7 is the aspect 1-6 further including an internal connector attached to the board, and the internal connector includes a housing, with the impact portion formed to the housing.

The present aspect includes the internal connector attached to the board, and the internal connector includes the housing. The impact portion is formed to the housing, thereby enabling effective utilization of the housing of the internal connector.

Note that the housing in the present aspect not only means a member made from resin (an internal housing 52 in an exemplary embodiment described later), but also encompasses another member attached to a member made from resin (for example, a seal and a fixing (fixing members 53 in an exemplary embodiment described later)).

An electrical device according to an aspect 1-8 is the aspect 1-6 wherein the resin section includes an impactor gap section, and the gate mark of the resin section is formed at a position facing toward the impactor gap section.

In the present aspect the resin section includes the impactor gap section, and the gate mark of the resin section is formed at the position facing toward the impactor gap section.

This thereby enables a tool to be disposed at the position of the impactor gap section during insert molding. When such an approach is adopted, the force of the molten resin injected at high pressure is weakened by impacting the tool. This thereby enables the terminal to be suppressed from being pulled away from the board by the terminal being impacted by the molten resin at high force.

A manufacturing method of an electrical device according to an aspect 1-9 is a manufacturing method for an electrical device including a board, a terminal connected to the board, and a resin section that retains the board and the terminal. The manufacturing method includes a step of forming the resin section by insert molding with the board and the terminal as inserts, and in the manufacturing method the terminal is not attached to the board at the stage when the board and the terminal are placed in the mold for insert molding.

Hitherto in a manufacturing method, terminals are attached to a board in advance prior to insert molding, and so sometimes the board and the terminals are difficult to place in the mold for insert molding due to misalignment of the attachment position of the terminals with respect to the board, with this having an adverse effect on productivity.

In contrast thereto, in the manufacturing method according to the present aspect the terminal is not attached to the board at the stage when the board and the terminal are placed in the mold for insert molding. This thereby enables the board and the terminal to be easily placed with respect to the mold, and productivity is raised as a result thereof.

In a manufacturing method of an electrical device according to an aspect 1-10, the terminal and a metal member, including a frame shaped support section for supporting the terminal, are set in the mold at the step for forming the resin section by insert molding.

In the present aspect, the terminal and the metal member, including the support section for supporting the terminal, are set in the mold at the step for forming the resin section by insert molding. This support section is frame shaped and so the support section is not liable to flex, facilitating setting the terminal at an appropriate position in the mold.

An electrical device according to an aspect 2-1 is an electrical device including a board, an electrical component bonded to the board by soldering, and a resin section that retains the board and the electrical component. In the electrical device the resin section is formed by insert molding with the board and the electrical component as inserts, a resin for configuring the resin section is a thermoplastic resin, and a melting temperature of the resin for configuring the resin section is higher than a melting temperature of a solder for bonding the electrical component to the board.

In the present aspect, the electrical device includes the board, the electrical component bonded to the board by soldering, and the resin section that retains the board and the electrical component. The resin section is formed by insert molding with the board and the electrical component as inserts, as a result of which the electrical device has high water proofing, dust proofing, and anti-vibration characteristics.

Moreover, the resin for configuring the resin section is a thermoplastic resin, enabling the molding time for insert molding to be shortened, productivity to be raised, and the occurrence of resin burrs to be suppressed as compared to cases in which the resin for configuring the resin section is a thermoset resin.

Furthermore, the melting temperature of the resin for configuring the resin section is higher than the melting temperature of the solder for bonding the electrical component to the board. This facilitates use of a resin having a high melting temperature and facilitates use of a solder having a low melting point as compared to cases in which the melting temperature of the resin is lower than the melting temperature of the solder. Utilizing a resin having a high melting temperature enables the heat resistance of the electrical device to be raised, and deterioration of the electrical component due to heat during soldering can be prevented when a low melting point solder is used. The electrical device according to the present aspect is, accordingly, one having a high heat resistance and one in which deterioration of electrical components is prevented.

The prevailing view hitherto has been that were a high temperature molten resin to contact the soldered portions of the electrical components, then the solder would melt at the soldered portions. Therefore, the resin and solder were selected such that "melting temperature of resin section <melting temperature of solder" (see Patent Document 1). However, the inventors of the present disclosure have discovered, as the result of the test described below, that such problems do not arise at the soldered portions even in cases in which "melting temperature of resin section >melting temperature of solder".

In an exemplary embodiment described below, an example is described in which the resin for configuring the resin section is PPS; however, the resin for configuring the resin section of the present aspect is not limited thereto, and another resin such as, for example, PA 9t (polyamide 9T), a liquid crystal polymer (LCP), or the like may be employed.

Moreover, although, in an exemplary embodiment described below, an example is described in which the solder for bonding the electrical component to the board is SAC 305, the solder for bonding the electrical component to the board of the present aspect is not limited thereto.

An electrical device according to an aspect 2-2 is the aspect 2-1, wherein the melting temperature of the resin for configuring the resin section is at least 60° C. higher than the melting temperature of the solder for bonding the electrical component to the board.

In the present aspect, the melting temperature of the resin for configuring the resin section is at least 60° C. higher than the melting temperature of the solder for bonding the electrical component to the board.

The electrical device according to the present aspect accordingly has even higher heat resistance and deterioration of the electrical component is prevented even more.

Note that the present inventors have discovered from the test example described later that no issue occurs at the connection between the electrical component and the board even in cases in which the melting temperature of the resin for configuring the resin section is at least 60° C. higher than the melting temperature of the solder for bonding the electrical component to the board.

The electrical device according to an aspect 2-3 is the aspect 2-1 or the aspect 2-2, wherein the electrical device is employed by being attached to an attachment target, the electrical device includes a terminal, the terminal includes a connection portion that is surface mountable to an attachment surface of the attachment target, and the melting temperature of the resin for configuring the resin section is at least 270° C.

In the present aspect the electrical device is one employed by being attached to an attachment target. The electrical device includes the terminal, and the terminal includes the connection portion that is surface mountable to an attachment surface of the attachment target. The melting temperature of the resin for configuring the resin section is at least 270° C., and so this enables the electrical device to be attached to the attachment target by, for example, reflow soldering in an environment of about 250° C.

An electrical device according to an aspect 2-4 is any one of the aspect 2-1 to the aspect 2-3, wherein the electrical device includes a terminal that is connected to the board and is connectable to an attachment target, and a connector section that is connected to the board and is connectable to an external connector.

In the present aspect, the electrical device includes the terminal that is connected to the board and is connectable to the attachment target, and includes the connector section that is connected to the board and is connectable to the external connector.

This thereby enables the electrical device to be attached to the attachment target such that the terminal is connected to the board, and moreover enables the attachment target and the external connector to be connected together by connecting the external connector to the connector section of the electrical device.

Note that although in an exemplary embodiment described later an example is described in which no bonding material such as solder or the like is employed at the connection location between the board and the terminal, the present aspect is not limited thereto, and a bonding material such as solder or the like may be employed at the connection location between the board and the terminal.

An electrical device according to an aspect 2-5 is the aspect 2-4 wherein the connector section includes an external side terminal and a housing to retain the external side terminal, and the housing is formed separately to the resin section.

In the present aspect the connector section includes the external side terminal and the housing to retain the external side terminal. The housing is formed separately to the resin section, facilitating freedom in forming the shape of the housing. Namely, this makes it easy to form the housing in a shape not able to be formed by insert molding, or a shape that would be difficult to form thereby.

An electrical device according to an aspect 2-6 is the aspect 2-4 wherein the connector section includes an external side terminal and a housing to retain the external side terminal, and the housing is formed by insert molding at the same time as the resin section.

In the present aspect, the connector section includes the external side terminal and the housing to retain the external side terminal. The housing is formed by insert molding at the same time as the resin section, enabling a process or the like for separately forming the housing to be omitted compared to an embodiment in which the housing is formed separately to the resin section, raising productivity thereby.

DESCRIPTION OF EMBODIMENTS

Description follows regarding a filter circuit in-built connector 10 according to an exemplary embodiment of an "electrical device" of the present disclosure. Note that for ease of explanation, in the following description ±X directions indicate front-rear directions in each of the drawings, ±Y directions indicate width directions (left-right directions) therein, and ±Z directions indicate up-down directions therein. Note that each of the drawings has been produced based on design drawings, and accurate dimensions, proportions, and angles are depicted therein.

Connector 10

Figure 1:
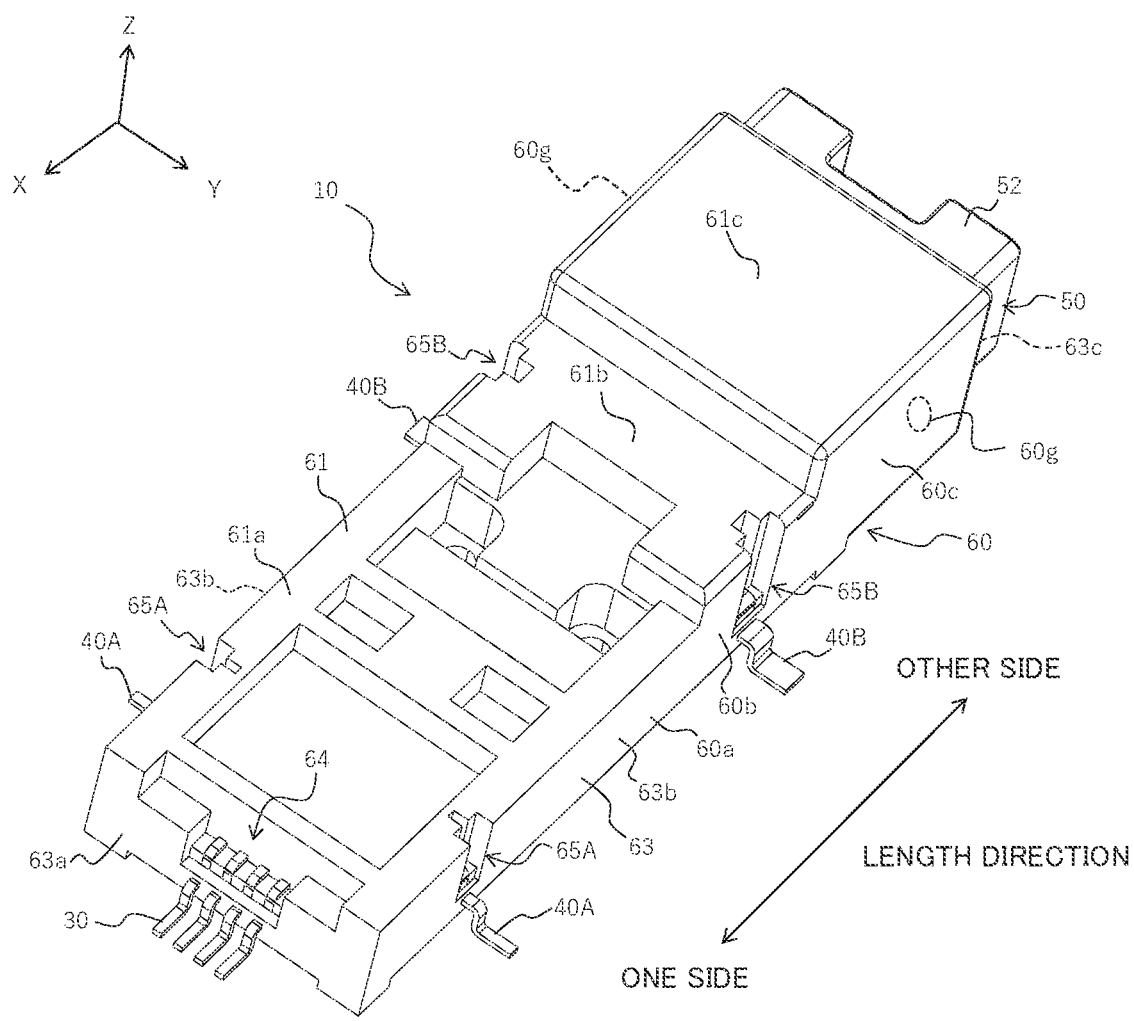
FIG. 1 is a perspective view of a connector.
Figure 2:
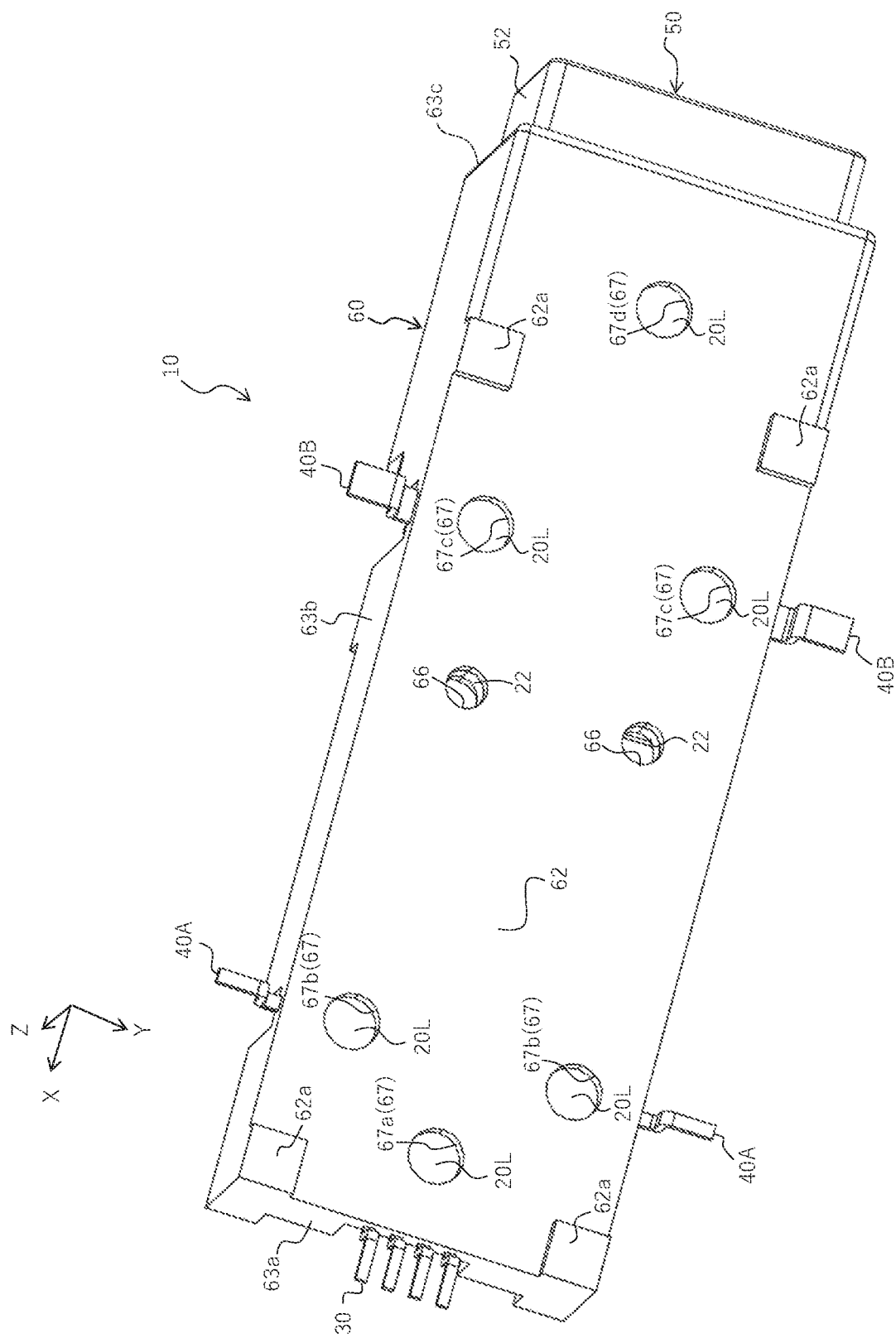
FIG. 2 is a perspective view of a connector as viewed from below.
Figure 3:
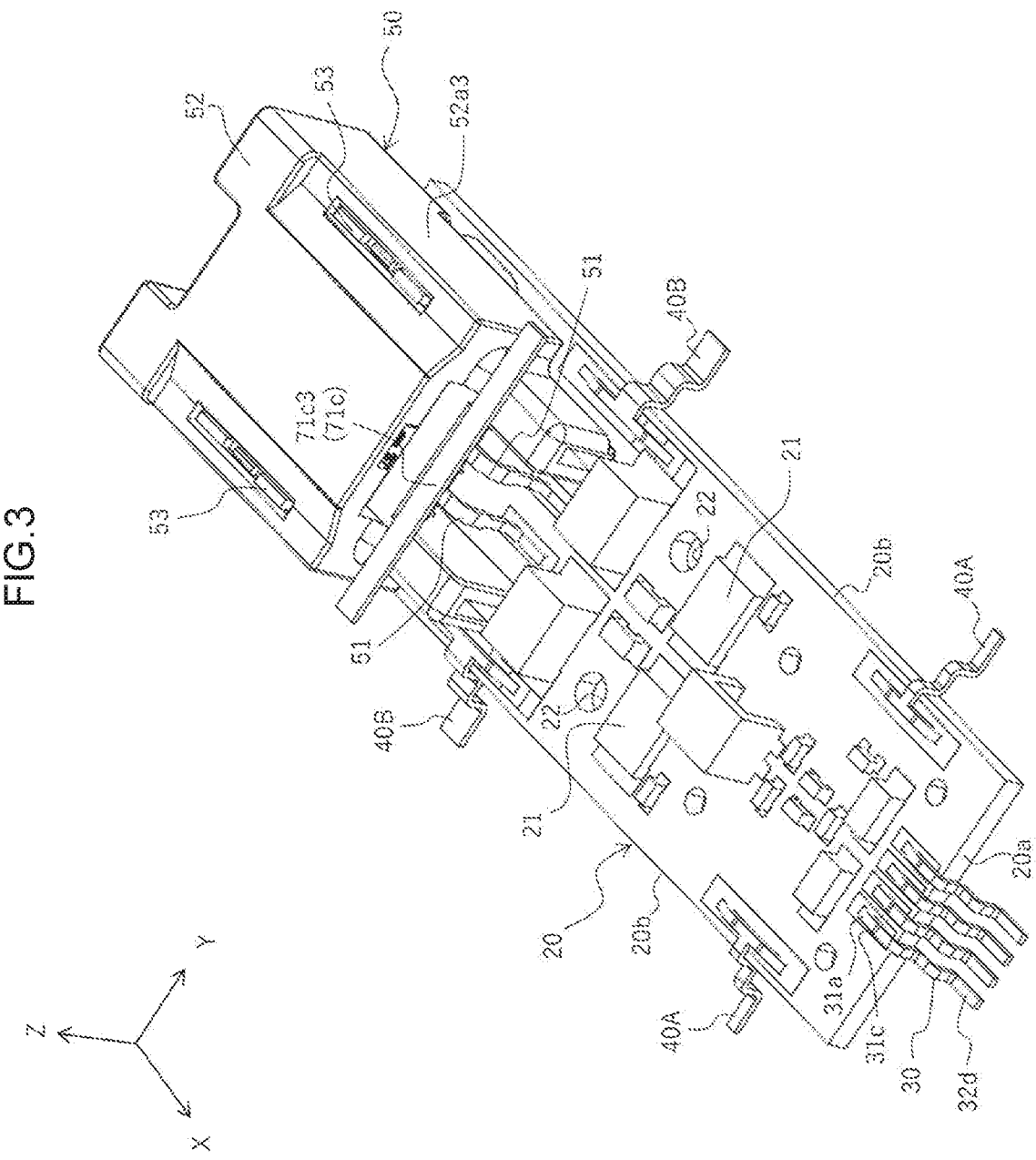
FIG. 3 is a perspective view of a connector illustrated with a resin section omitted.

As illustrated in FIG. 1 to FIG. 3, the filter circuit in-built connector 10 (hereafter referred to simply as the connector 10) includes an internal board 20 mounted with various electrical components 21, plural terminals 30, 40A, 40B connected to the internal board 20, and an internal connector 50 (connector section) connected to the internal board 20, with these covered by a resin section 60.

The connector 10 is configured so as to be attachable to an external board (omitted in the drawings) serving as an "attachment target". More specifically, the connector 10 is attached to the external board by soldering the plural terminals 30, 40A, 40B of the connector 10 to the external board in a state in which the connector 10 has been placed on a surface of the external board. The soldering is, for example, performed by reflow soldering.

The connector 10 is configured so as to be connectable to an external connector (omitted in the drawings) serving as a "connection target". More specifically, the connector 10 is connected to the external connector by fitting the internal connector 50 of the connector 10 together with the external connector.

The external board and the external connector can be connected together through the internal board 20 by the external connector being connected to the connector 10 when in an attached state to the external board.

A filter circuit is formed as an "electric circuit" by mounting the various electrical components 21 to the internal board 20. The external board and the external connector are accordingly connected together through the filter circuit.

The electrical component unit disclosed in Patent Document 2 however includes, on a board, a connector, a buffer output IC, and a filter circuit (electric circuit) configured including a coil, a capacitor, and a resistor. In such electrical devices, a layout of the electrical components configuring the electric circuit needs to be designed for stable input of signals to the buffer output IC. Due to this situation, design effort is accordingly required for such an electrical component unit.

In contrast thereto, employing the connector 10 according to the present exemplary embodiment removes the need for a complex circuit design and electrical component layout design in order to form the filter circuit (electric circuit). The design effort for the electrical component unit is accordingly reduced.

Next, detailed description follows regarding the connector 10 serving as an "electrical device".

Connector 10 Manufacturing Method

Manufacture of the connector 10 is, broadly speaking, performed in the following sequence.

Figure 14:
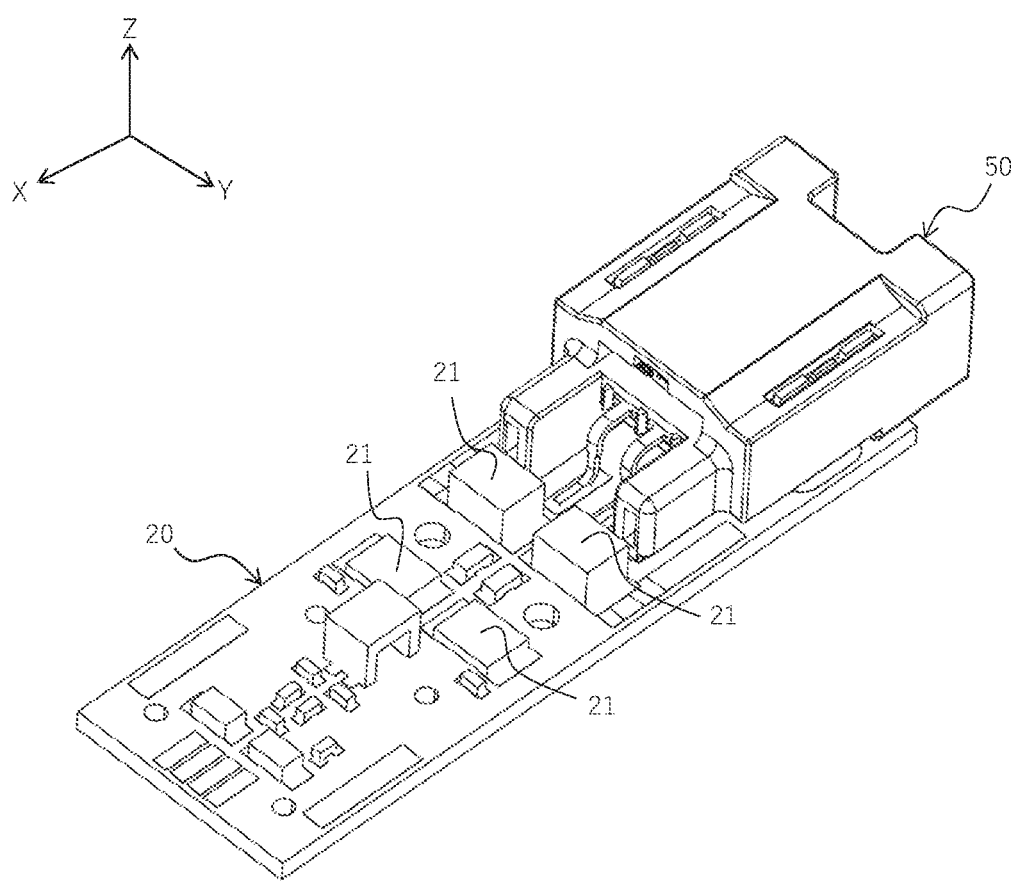
FIG. 14 is a perspective view of a board having an internal connector attached thereto.

(1) The plural electrical components 21 and the internal connector 50 are attached to the internal board 20 (see FIG. 14). More specifically, the plural electrical components 21 and the internal connector 50 are placed on the internal board 20 and reflow soldering is performed.

Figure 15:
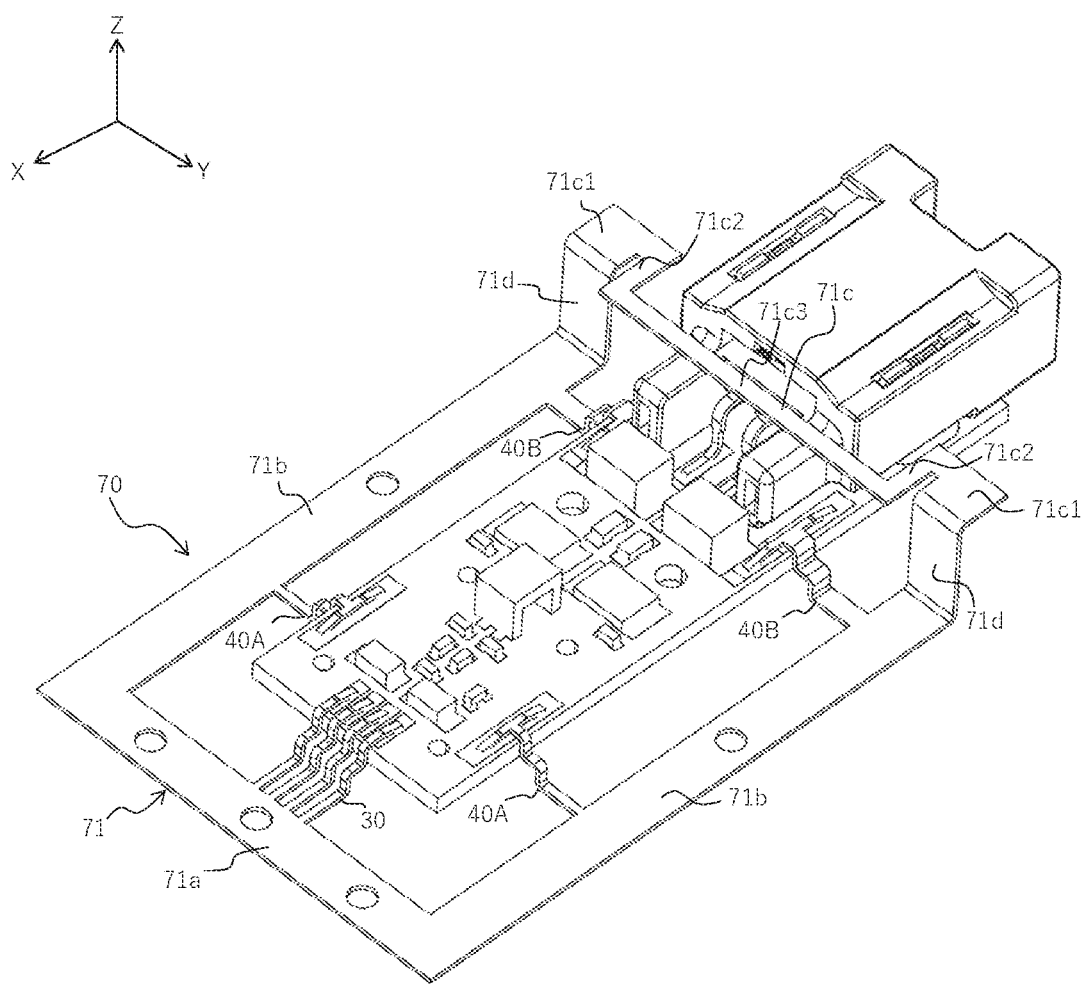
FIG. 15 is a perspective view illustrating a state in which a board and an insert metal member have been set in a mold for insert molding (the mold is omitted in the drawing).

(2) The internal board 20 with the plural electrical components 21 and the internal connector 50 attached thereto are set in a mold (bottom mold) for insert molding, and an insert metal member 70 is also set therein (see FIG. 15).

Figure 16:
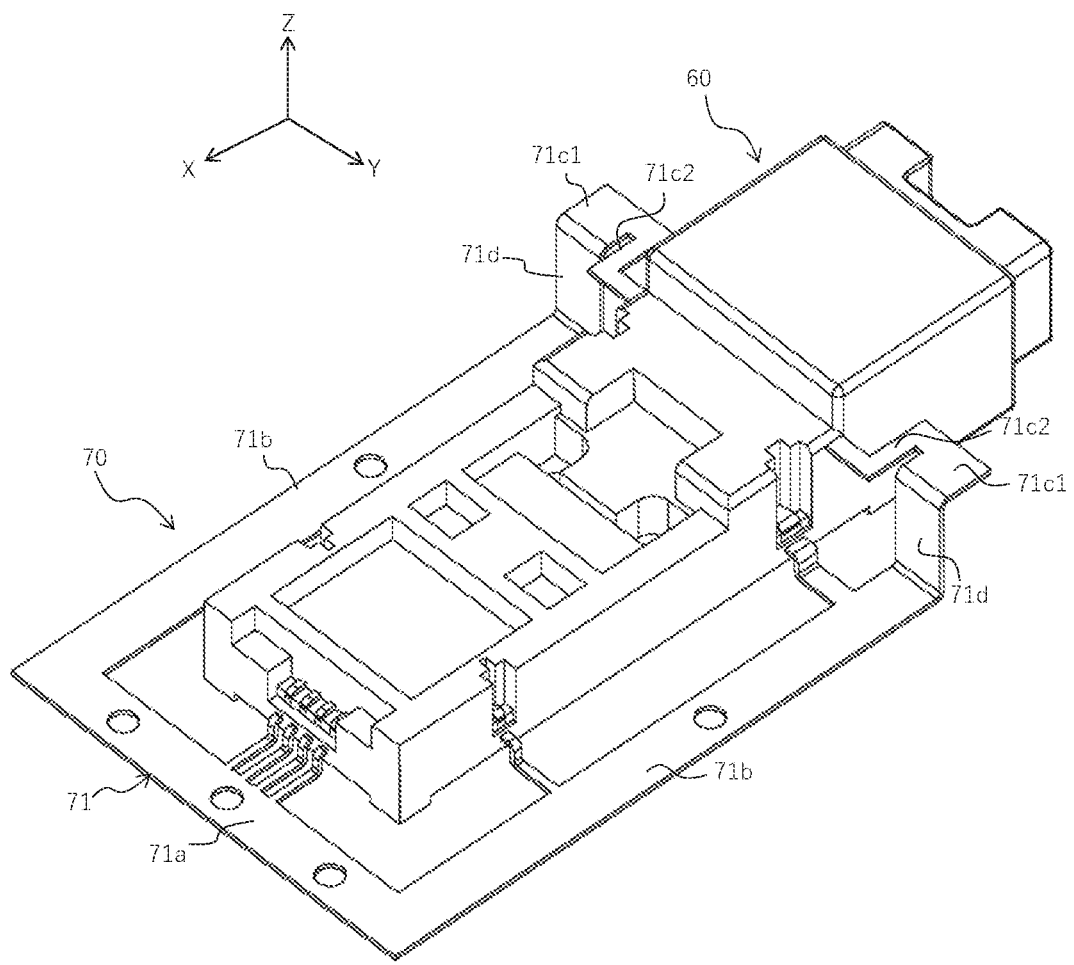
FIG. 16 is a perspective view illustrating a state after insert molding.

(3) The mold is closed, molten resin is injected therein, and the resin is hardened to form the resin section 60 (see FIG. 16).

(4) The insert metal member 70 is severed at specific cut positions (see FIG. 1).

Description follows regarding each configuration component of the connector 10.

Internal Board 20

The internal board 20 is a resist board.

The shape of the internal board 20 is a shape elongated in the front-rear direction, and more specifically is a rectangular shape having a length direction along the front-rear direction. In the illustrated example the front-rear dimension of the internal board 20 is at least twice the width dimension of the internal board 20.

A filter circuit is formed on the internal board 20. The filter circuit is configured by the plural electrical components 21 attached to the internal board 20, and a circuit in the internal board 20. The plural electrical components 21 include a resistor, a capacitor, and the like. The plural electrical components 21 are attached to the internal board 20 by being soldered to the internal board 20 using reflow soldering. A lead reflow solder, for example SAC305 (melting point: 217° C.), may be employed as such solder.

Internal Connector 50

Figure 12:
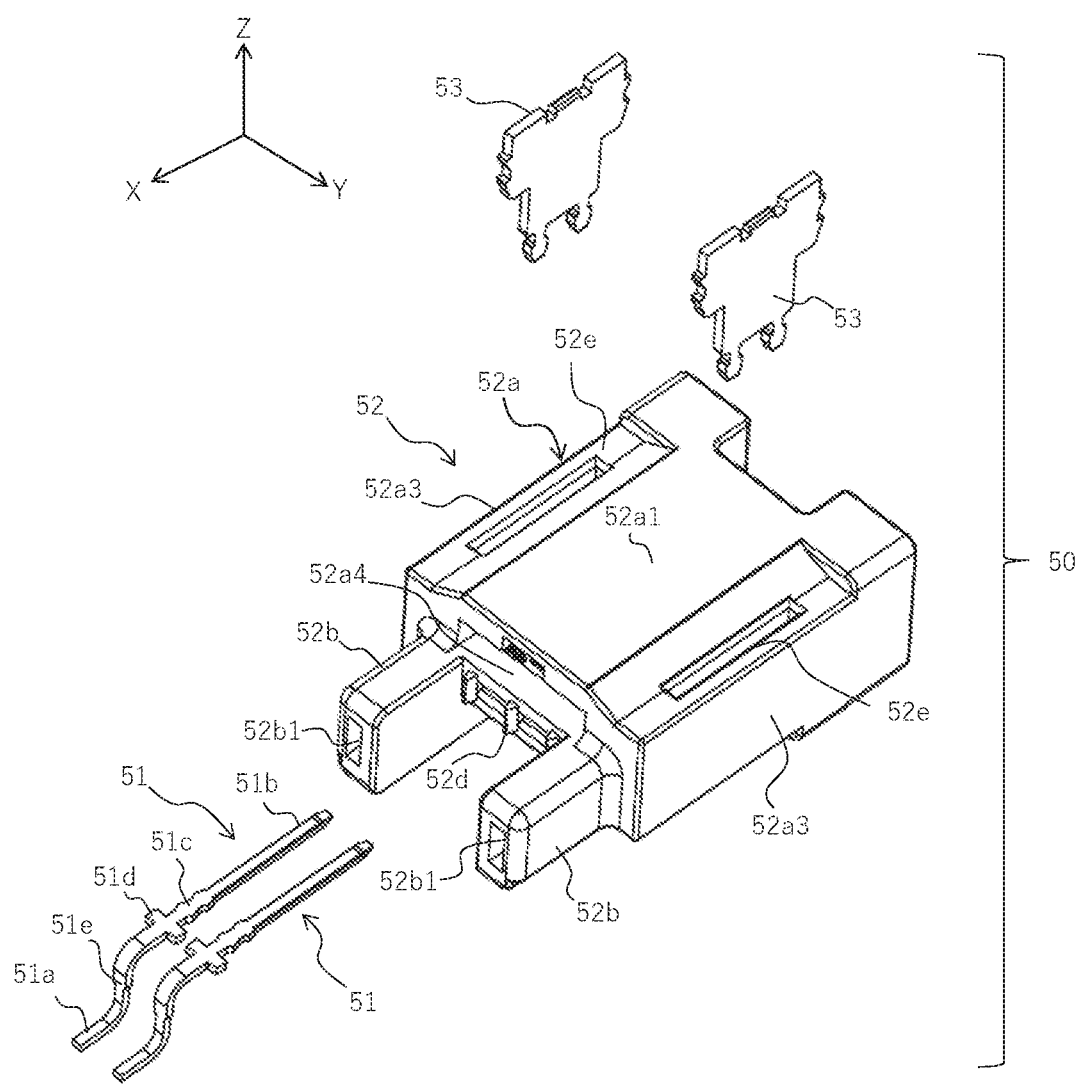
FIG. 12 is an exploded perspective view of an internal connector.
Figure 13:
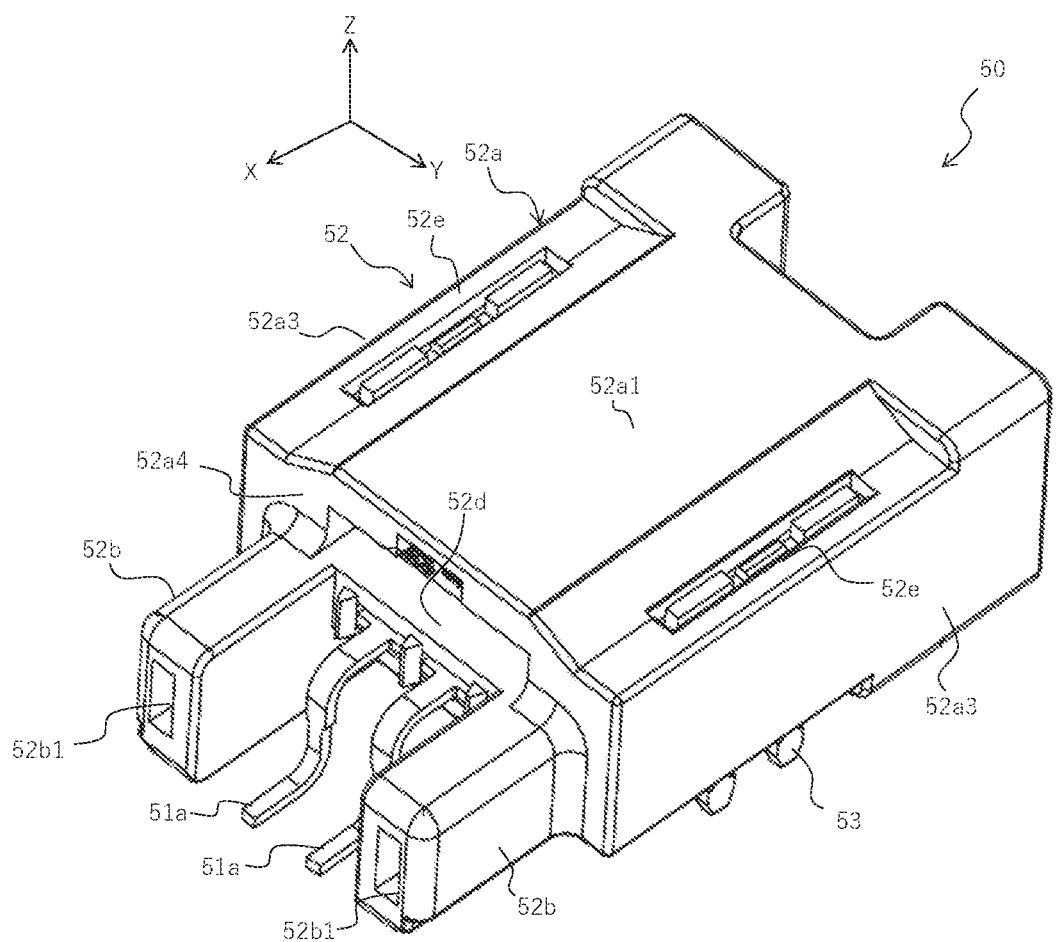
FIG. 13 is a perspective view of an internal connector.

As illustrated in FIG. 12 and FIG. 13, the internal connector 50 includes plural (two) internal terminals 51, an internal housing 52, and plural (two) fixing members 53.

The plural internal terminals 51 have the same structure as each other. The internal terminals 51 are relay terminals between the internal board 20 and the external connector. The internal terminals 51 each include a board connection portion 51a for connection to the internal board 20 by soldering, a contact portion 51b that contacts a terminal provided to the external connector, and a retained portion 51c retained by the internal housing 52.

The board connection portion 51a is attached to the internal board 20 by soldering to the internal board 20 using reflow soldering. A lead reflow solder, for example SAC305 (melting point: 217° C.), may be employed as such solder.

The retained portion 51c is formed between the board connection portion 51a and the contact portion 51b, and is retained by the internal housing 52 by being press-fitted into the internal housing 52. The internal terminals 51 are press-fitted into the internal housing 52 from the front side thereof. Press-fit protrusions are formed to the two width direction sides of the retained portion 51c.

The internal terminals 51 each include a press-fit shoulder 51d formed with a wider width to adjacent portions. The press-fit shoulder 51d is formed at the front side of the retained portion 51c. The retained portion 51c of the internal terminal 51 is press-fitted into the internal housing 52 by the press-fit shoulder 51d being pressed from the front side using a tool or the like.

The internal terminals 51 each include a crank portion 51e. One side of the internal terminal 51 with respect to the crank portion 51e extends in a forward direction in a straight line, and the other side thereof extends in a rearward direction in a straight line. The crank portion 51e is formed between the board connection portion 51a and the press-fit shoulder 51d.

The internal housing 52 is formed from an insulator, such as a synthetic resin or the like. The internal housing 52 includes an indentation 52c (see FIG. 4) open in a rearward direction, in a configuration in which the external connector is able to be fitted therein from the rear side.

As illustrated in FIG. 12, the internal housing 52 includes a main body portion 52a that includes an upper wall 52a1, a lower wall 52a2 (see FIG. 4), a pair of side walls 52a3, and a bottom wall 52a4.

The internal housing 52 includes a terminal retaining portion 52d to retain the internal terminals 51. The terminal retaining portion 52d is formed at a width direction central portion of the bottom wall 52a4 of the main body portion 52a. Through holes are formed in the terminal retaining portion 52d for the internal terminals 51 to pass through, and the contact portion 51b of each of the internal terminals 51 is disposed inside the indentation 52c by the internal terminal 51 being press-fitted into the through hole from the front side.

The internal housing 52 includes fixing member retaining portions 52e for retaining fixing members 53. The fixing member retaining portions 52e are formed to the pair of side walls 52a3 of the main body portion 52a. Press-fit holes are formed in the fixing member retaining portions 52e for the fixing members 53 to be press-fitted into. The fixing members 53 are press-fitted into the press-fit holes from above.

The internal housing 52 includes terminal protection portions 52b. The terminal protection portions 52b protect the board connection portions 51a of the internal terminal 51 from the two width direction sides. The terminal protection portions 52b are formed at the two width direction sides with respect to positions where the board connection portions 51a of the internal terminals 51 are disposed. The terminal protection portions 52b project forward from the main body portion 52a of the internal housing 52. Front ends of the terminal protection portions 52b are positioned further forward than front ends of the board connection portions 51a. A hole portion 52b1 open toward the front side is formed in each of the terminal protection portions 52b. Resin for configuring the resin section 60 is poured into the hole portions 52b1 (see FIG. 4).

Terminals 30, 40A, 40B

As illustrated in FIG. 3, the plural terminals 30, 40A, 40B include plural (four) first terminals 30, plural (two) second terminals 40A, and plural (two) third terminals 40B. These will simply be referred to below as terminals 30, 40A, 40B when not particularly discriminating therebetween.

Figure 6:
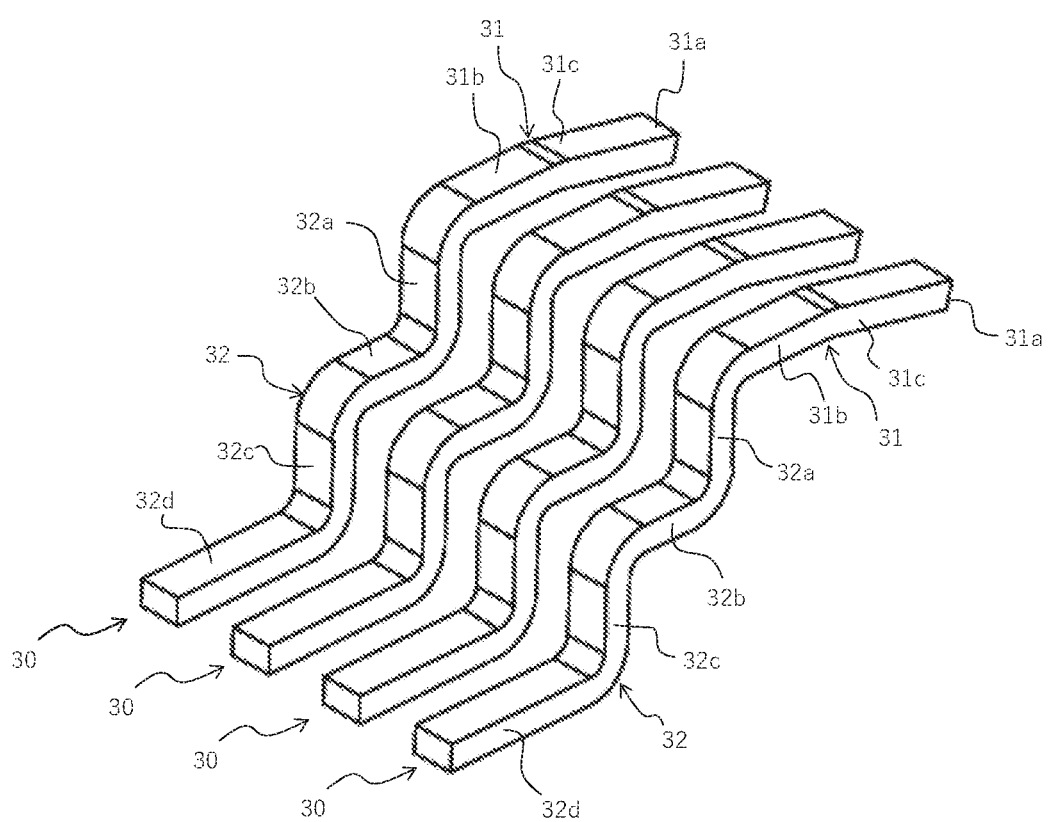
FIG. 6 is a perspective view illustrating a first terminal.
Figure 7A:
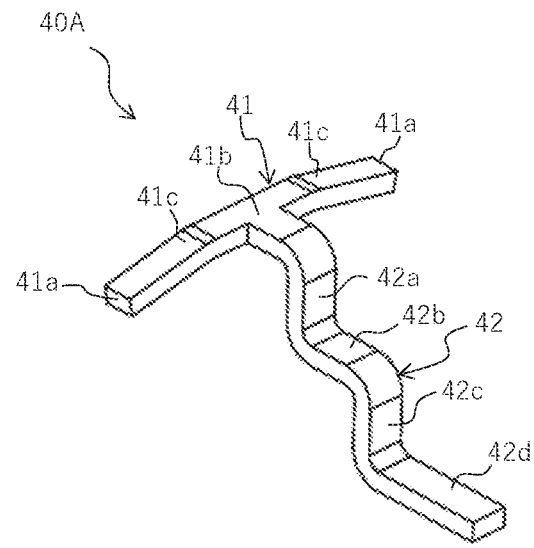
FIG. 7A is a perspective view illustrating a second terminal.
Figure 7B:
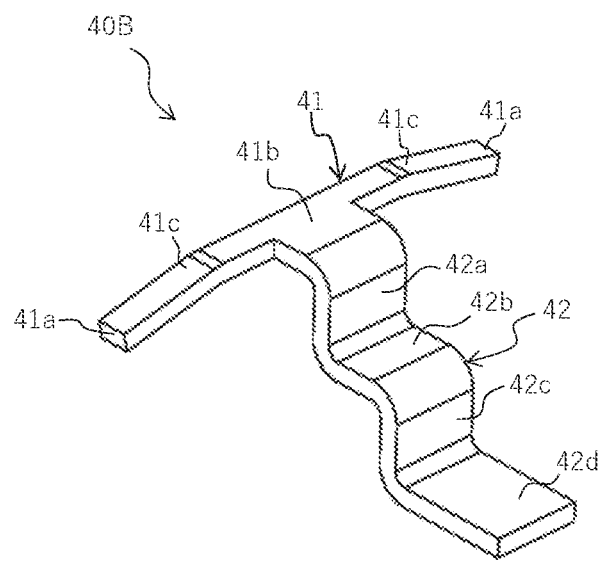
FIG. 7B is a perspective view illustrating a third terminal.

The terminals 30, 40A, 40B are relay terminals between the internal board 20 and the external board. Namely, as illustrated in FIG. 6, FIG. 7A, and FIG. 7B, the terminals 30, 40A, 40B include internal side connection portions 31a, 41a for connection to the internal board 20, and external side connection portions 32d, 42d connectable to the external board.

The internal side connection portions 31a, 41a are in a state of contact with the internal board 20 (specifically with pads of the internal board 20) from above. The terminals 30, 40A, 40B and the internal board 20 are connected together thereby.

The resin section 60 is formed by insert molding while in a state in which the internal side connection portions 31a, 41a of the terminals 30, 40A, 40B are still contacted against the internal board 20, and the internal board 20 and the terminals 30, 40A, 40B are retained by the resin section 60, thereby maintaining the connected state. The internal side connection portions 31a, 41a are entirely covered by the resin section 60.

The external side connection portions 32d, 42d are positioned at the outside of the internal board 20 in plan view. The external side connection portions 32d, 42d are not covered by the resin section 60. The external side connection portions 32d extend in a direction away from the internal board 20 in a plane parallel to the internal board 20, and are configured so as to be surface mountable to the external board.

The terminals 30, 40A, 40B include resilient portions 31c, 41c retained by the resin section 60 in a resiliently deformed state. The resin section 60 is formed by insert molding while in a state in which the internal side connection portions 31a, 41a are contacting the internal board 20 from above, and portions of the terminals 30, 40A, 40B distanced from the internal side connection portions 31a, 41a (i.e. press portions 31b, 41b) are being pressed from above. The portions between the internal side connection portions 31a, 41a and the press portions 31b, 41b are accordingly configured by the resilient portions 31c, 41c. The insert molding is performed in a state in which the press portions 31b, 41b are pressed by the mold or the like, and so upper faces of the press portions 31b, 41b are not covered by the resin section 60 (see FIG. 6, FIG. 7A, FIG. 7B). However, the internal side connection portions 31a, 41a pressed against the internal board 20 are maintained in a state of good connection by being entirely covered by the resin section 60.

The internal side connection portions 31a, 41a, the press portions 31b, 41b, and the resilient portions 31c, 41c described above are collectively referred to as resilient contact sections 31, 41. The resilient contact sections 31, 41 are sections that resiliently deform so as to make press contact with the internal board 20 under recovery force therefrom.

The terminals 30, 40A, 40B include external side extension sections 32, 42. The external side extension sections 32, 42 include, in this sequence, first extension portions 32a, 42a extending in a downward direction, second extension portions 32b, 42b extending in a direction away from the internal board 20, third extension portions 32c, 42c extending in a downward direction, and fourth extension portions 32d, 42d extending in a direction away from the internal board 20.

Figure 8:
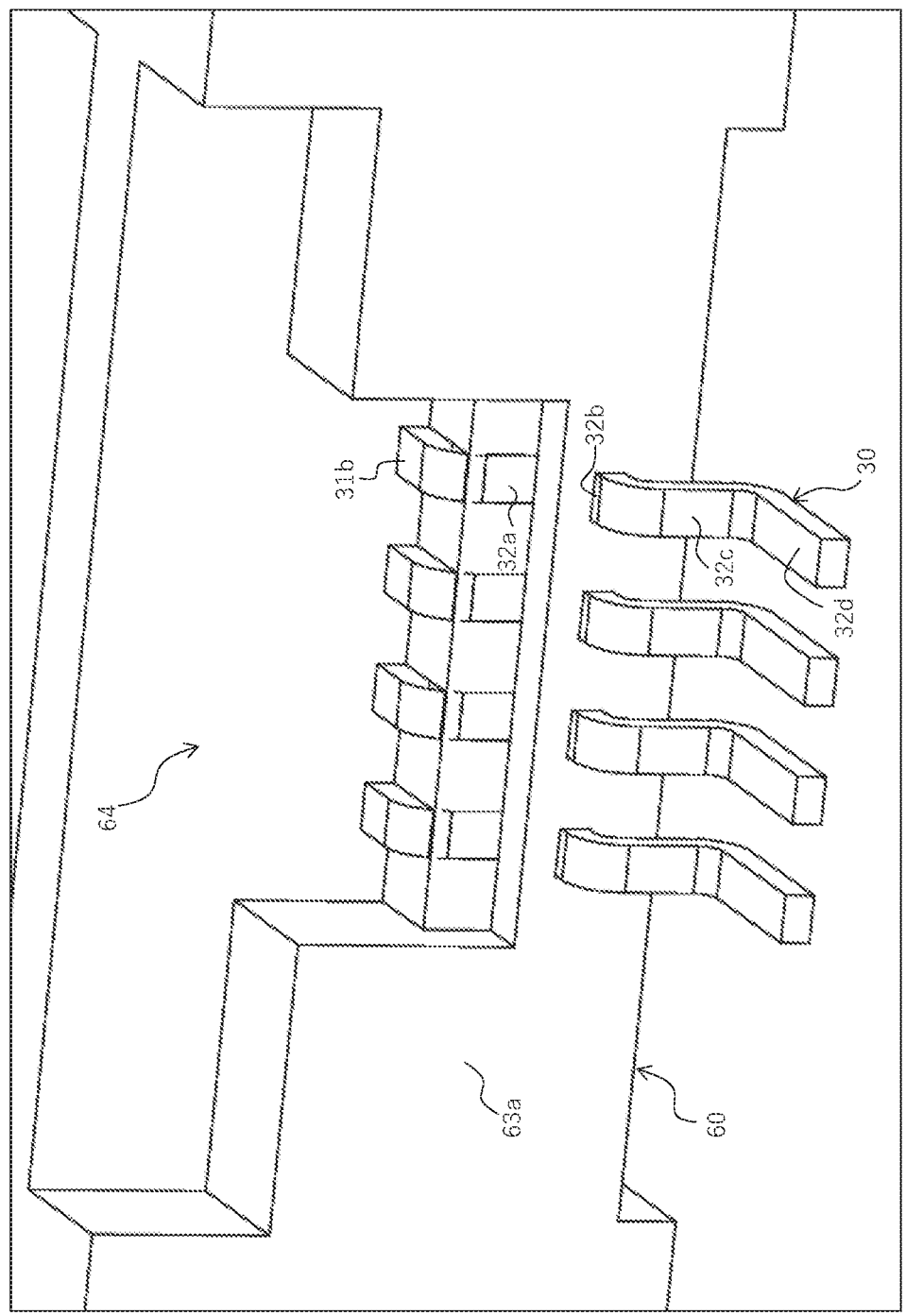
FIG. 8 is a perspective view illustrating an enlargement of the vicinity of first terminals of a connector.
Figure 9A:
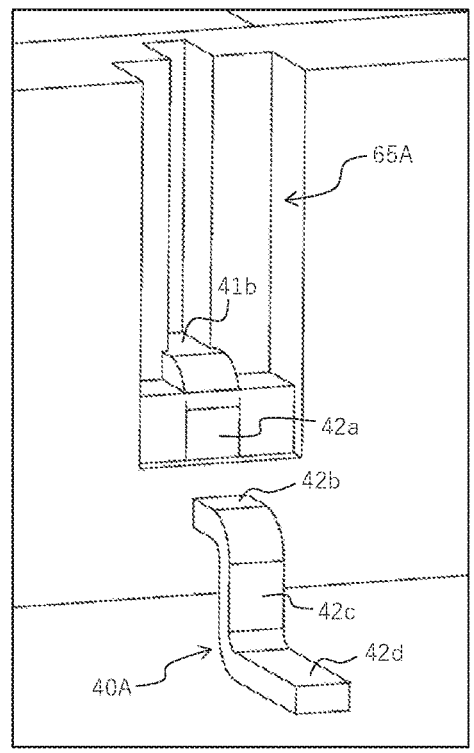
FIG. 9A is a perspective view illustrating an enlargement of the vicinity of a second terminal of a connector.
Figure 9B:
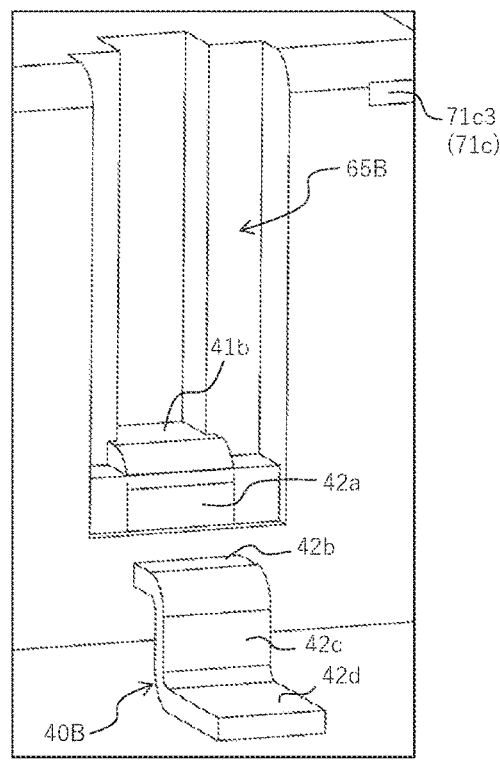
FIG. 9B is a perspective view illustrating an enlargement of the vicinity of a third terminal of a connector.

Faces on the board outside of the first extension portions 32a, 42a are exposed from the resin section 60. The other faces of the first extension portions 32a, 42a are covered by the resin section 60. The faces of the first extension portions 32a, 42a that are exposed from the resin section 60 have a same-plane relationship with the external face of the resin section 60 adjacent thereto (see FIG. 8, FIG. 9A, and FIG. 9B).

Bent portions are formed between the second extension portions 32b, 42b and the first extension portions 32a, 42a, with these bent portions entirely buried in the resin section 60. Bent portions are formed between the second extension portions 32b, 42b and the third extension portions 32c, 42c, with these bent portions entirely exposed from the resin section 60. The fourth extension portions 32d, 42d are positioned below a lower face of the internal board 20. The fourth extension portions 32d, 42d function as external side connection portions 32d, 42d, and are surface mounted to the external board.

Next, description follows regarding a characteristic configuration of the first terminals 30.

The internal side connection portions 31a of the first terminals 30 are positioned in the vicinity of a front edge 20a of the internal board 20, and the external side connection portions 32d of the first terminals 30 are positioned in front of the internal board 20.

There are plural (four) of the first terminals 30 provided. The plural first terminals 30 are arrayed in close proximity to each other. The array direction of the first terminals 30 is along the width direction. The first terminals 30 are attached in the vicinity of the front edge 20a of the internal board 20, and the array direction of the plural first terminals 30 is a direction parallel to the extension direction of the front edge 20a.

The resilient portions 31c of the first terminals 30 extend in the front-rear direction. The extension direction of the resilient portions 31c of the first terminals 30 is a direction perpendicular to the array direction of the first terminals 30, and is a direction parallel to the length direction of the internal board 20. The resilient contact sections 31 and the external side extension sections 32 of the first terminals 30 extend in a straight line in plan view.

Next, description follows regarding a characteristic configuration of the second terminals 40A and the third terminals 40B. These are collectively referred to below as side terminals 40 when not discriminating between the second terminals 40A and the third terminals 40B.

The internal side connection portions 41a of the side terminals 40 are positioned in the vicinity of side edges 20b of the internal board 20, and the external side connection portions 42d of the side terminals 40 are positioned at the width direction outside of the internal board 20.

Two of the second terminals 40A are provided. The two second terminals 40A include a right second terminal 40A and a left second terminal 40A. The two second terminals 40A have the same structure as each other.

Two of the third terminals 40B are provided. The two third terminals 40B include a right third terminal 40B and a left third terminal 40B. The two third terminals 40B have the same structure as each other.

Two of the resilient portions 41c of the side terminals 40 are provided. The two resilient portions 41c are each configured from a resilient portion 41c extending forward from the press portion 41b, and a resilient portion 41c extending rearward from the press portion 41b. The leading end portions of the resilient portion 41c are configured by portions (internal side connection portions 41a, "contact portions") that contact the internal board 20 from above.

The resilient portions 41c of the side terminals 40 extend in the front-rear direction. The front-rear direction, which is the extension direction of the resilient portions 41c of the side terminals 40, is a direction perpendicular to the extension direction of the external side extension sections 42 of the second terminals 40A, and is a direction parallel to the length direction of the internal board 20.

The press portions 41b of the side terminals 40 have a T-shape in plan view, and are connected to the first extension portions 42a of the external side extension sections 42 through bent portions.

Differences Between Second Terminals 40A and Third Terminals 40B

The second terminals 40A are arranged at the front side of the third terminals 40B. The width dimension (front-rear direction dimension) of the external side extension sections 42 of the third terminals 40B is greater than the width dimension of the external side extension sections 42 of the second terminals 40A. The length (width direction dimension) of the resilient contact sections 41 of the third terminals 40B is longer than the length of the resilient contact sections 41 of the second terminals 40A.

Resin Section 60

The resin section 60 is formed by insert molding with inserts of the internal board 20 having the plural electrical components 21 attached thereto, the plural terminals 30, 40A, 40B, and the internal connector 50. The resin section 60 retains the internal board 20, the plural terminals 30, 40A, 40B, and the internal connector 50. The resin for configuring the resin section 60 is, for example, Poly Phenylene Sulfide (PPS).

As illustrated in FIG. 1 and FIG. 2, the resin section 60 has a shape elongated in the front-rear direction, and more specifically is a substantially cuboid shape. The resin section 60 includes an upper face 61, a lower face 62, and peripheral faces 63. The peripheral faces 63 include a front face 63a, a pair of side faces 63b, and a rear face 63c.

The front face 63a of the resin section 60 has a normal direction facing in a forward direction.

The pair of side faces 63b of the resin section 60 have normal directions facing toward the width direction outsides.

The upper face 61 of the resin section 60 has a normal direction facing in an upward direction.

The lower face 62 of the resin section 60 has a normal direction facing in a downward direction.

The resin section 60 may be divided into a front portion 60a, an intermediate portion 60b, and a rear portion 60c according to the height of the upper face 61. Namely, the upper face 61 of the resin section 60 includes a front portion upper face 61a, an intermediate portion upper face 61b, and a rear portion upper face 61c. The front portion upper face 61a is the lowest thereof, and the rear portion upper face 61c is the highest thereof.

The lower face 62 and the pair of side faces 63b of the resin section 60 are flush with the front portion 60a, the intermediate portion 60b, and the rear portion 60c.

The resin section 60 includes a first indentation 64. The first indentation 64 is formed at a position corresponding to the plural first terminals 30. The first indentation 64 is formed so as to be indented with respect to the upper face 61 and the peripheral faces 63 (specifically the front face 63a). The first indentation 64 corresponds a position where part of the mold is disposed during insert molding. As is apparent from FIG. 5 and FIG. 8, this part of the mold presses the press portions 31b of the first terminals 30 from above during insert molding, holds the press portions 31b of each of the plural first terminals 30 in place from the two width direction sides, and holds the first extension portions 32a of each of the first terminals 30 in place from the front side. This thereby enables the molten resin to be injected into the mold without misalignment of the position of the first terminals 30.

The resin section 60 includes second indentations 65A and third indentations 65B. The second indentations 65A are formed at positions corresponding to the second terminals 40A, and the third indentation 65B are formed at positions corresponding to the third terminals 40B. These will be called side indentations 65 when not discriminating between the second indentation 65A and the third indentation 65B.

The side indentations 65 are formed so as to be indented with respect to the upper face 61 and the peripheral faces 63 (specifically the side faces 63b). The second indentations 65A corresponds to positions where parts of the mold are disposed during insert molding. As is apparent from FIG. 9A and FIG. 9B, these parts of the mold press the press portion 41b of the side terminals 40 from above during insert molding, hold the press portions 41b of the side terminals 40 in place from both front and rear direction sides, and hold the first extension portions 42a of the side terminals 40 in place from the width direction outside. The molten resin is accordingly injected without displacement of the position of the side terminals 40.

The internal connector 50 is buried in the intermediate portion 60b and the rear portion 60c of the resin section 60. More specifically, the terminal protection portions 52b of the internal housing 52 of the internal connector 50 and a portion of the internal terminals 51 are buried in the intermediate portion 60b of the resin section 60, and other portions of the internal connector 50 are buried in the rear portion 60c of the resin section 60.

A rear end portion of the internal housing 52 of the internal connector 50 is not buried in the resin section 60, and is instead exposed from the resin section 60.

As illustrated in FIG. 2, the resin section 60 includes lower projection portions 62a projecting downward from the lower face 62. There are plural (four) of the lower projection portions 62a formed. Two out of the plural lower projection portions 62a are formed to width direction outside edges at a front end of the resin section 60. The other two of the plural lower projection portions 62a are formed to width direction outside edges of the rear portion 60c of the resin section 60.

As illustrated in FIG. 2, the resin section 60 includes lower holes 66, 67 open downward. The shape of the lower holes 66, 67 is circular. The lower holes 66, 67 are holes penetrating the resin section 60 in the up-down direction. There are plural of the lower holes 66, 67 formed. The plural lower holes 66, 67 include plural first lower holes 66 and plural second lower holes 67.

The first lower holes 66 are formed a position corresponding to through holes 22 (see FIG. 3) of the internal board 20. During insert molding, portions of the bottom mold are disposed at the positions of the first lower holes 66 and the through holes 22 of the internal board 20. The position of the internal board 20 is thereby fixed in the front-rear direction and the width direction with respect to the bottom mold.

A lower face 20L of the internal board 20 is positioned behind the second lower holes 67. During insert molding, portions of the bottom mold are disposed at the positions where the second lower holes 67 are formed, and these portions of the bottom mold support the internal board 20 from the lower face 20L side.

There are plural of the second lower holes 67 formed. The plural second lower holes 67 include a first support hole 67a, a second support hole 67b, and a third support hole 67c.

The first support hole 67a is a hole for supporting the internal board 20 from below formed at a position corresponding to the first terminals 30.

The second support hole 67b is a hole for supporting the internal board 20 from below formed at a position corresponding to the second terminals 40A.

The third support hole 67c is a hole for supporting the internal board 20 from below formed at a position corresponding to the third terminals 40B.

The width direction position of the first support hole 67a is a central position of a region where the plural first terminals 30 are disposed. The front-rear direction position of the first support hole 67a is aligned with a front-rear direction position of the internal side connection portions 31a of the plural first terminals 30.

The front-rear direction position of the second support hole 67b is a position between the two internal side connection portions 41a of the second terminals 40A.

The front-rear direction position of the third support hole 67c is a position between the two internal side connection portions 41a of the third terminals 40B.

The plural second lower holes 67 include a fourth support hole 67d. The fourth support hole 67d supports the internal board 20 from below at a position corresponding to the internal housing 52.

Insert Metal Member 70

As illustrated in FIG. 15, the insert metal member 70 is made by performing punch processing, bend processing, and the like on a metal plate.

The insert metal member 70 includes plural terminal portions 30, 40A, 40B that will become the plural terminals 30, 40A, 40B, and a support section 71 to support the plural terminal portions 30, 40A, 40B.

The support section 71 is formed in a frame shape. The support section 71 includes a front portion 71a, a pair of side portions 71b, and an upper section 71c.

The front portion 71a is disposed at the front side of the internal board 20 and extends in a straight line in the width direction.

Each of the pair of side portions 71b is disposed at the width direction outside of the internal board 20 and extends in a straight line in the front-rear direction.

The upper section 71c is disposed above the internal board 20 and extends in the width direction.

The support section 71 include a pair of coupling portions 71d for coupling the pair of side portions 71b and the upper section 71c together. The pair of coupling portions 71d are each an up-down coupling portion 71d having a plate thickness direction facing in the front-rear direction.

The upper section 71c includes a pair of outside portions 71c1 extending from an upper end of the pair of coupling portions 71d in a rearward direction, a pair of inside portions 71c2 extending in a forward direction at the width direction inside of the pair of outside portions 71c1, and a central portion 71c3 connecting front ends of the pair of inside portions 71c2 together in the width direction.

A portion of the upper section 71c (a portion of the central portion 71c3) is disposed inside the mold used for insert molding and is retained by the resin section 60. After insert molding the upper section 71c is severed at portions exposed from the resin section 60, and the portion of the upper section 71c retained in the resin section 60 becomes a portion of the connector 10 (see FIG. 3). The central portion 71c3 of the upper section 71c is disposed so as to contact the terminal protection portions 52b of the internal housing 52 of the internal connector 50 from above.

Test Example

The inventors manufactured an actual connector 10 as described above under the following conditions.

Volume of resin for configuring the resin section 60: 1568 mm$^3$

Type of resin for configuring the resin section 60: PPS (melting point: 280° C.)

Temperature of molten resin during injection: 310° C.

Type of solder for soldering portions of the electrical components 21 and the internal connector 50 to the internal board 20: SAC 305 (melting point: 217° C.)

Note that in the following description in respect to the solder, the solid phase line is melted from out of a solid phase line (217° C.) and liquid phase line (220° C.).

Each of the above melting points correspond to the "melting temperature" of the present disclosure.

Figure 10:
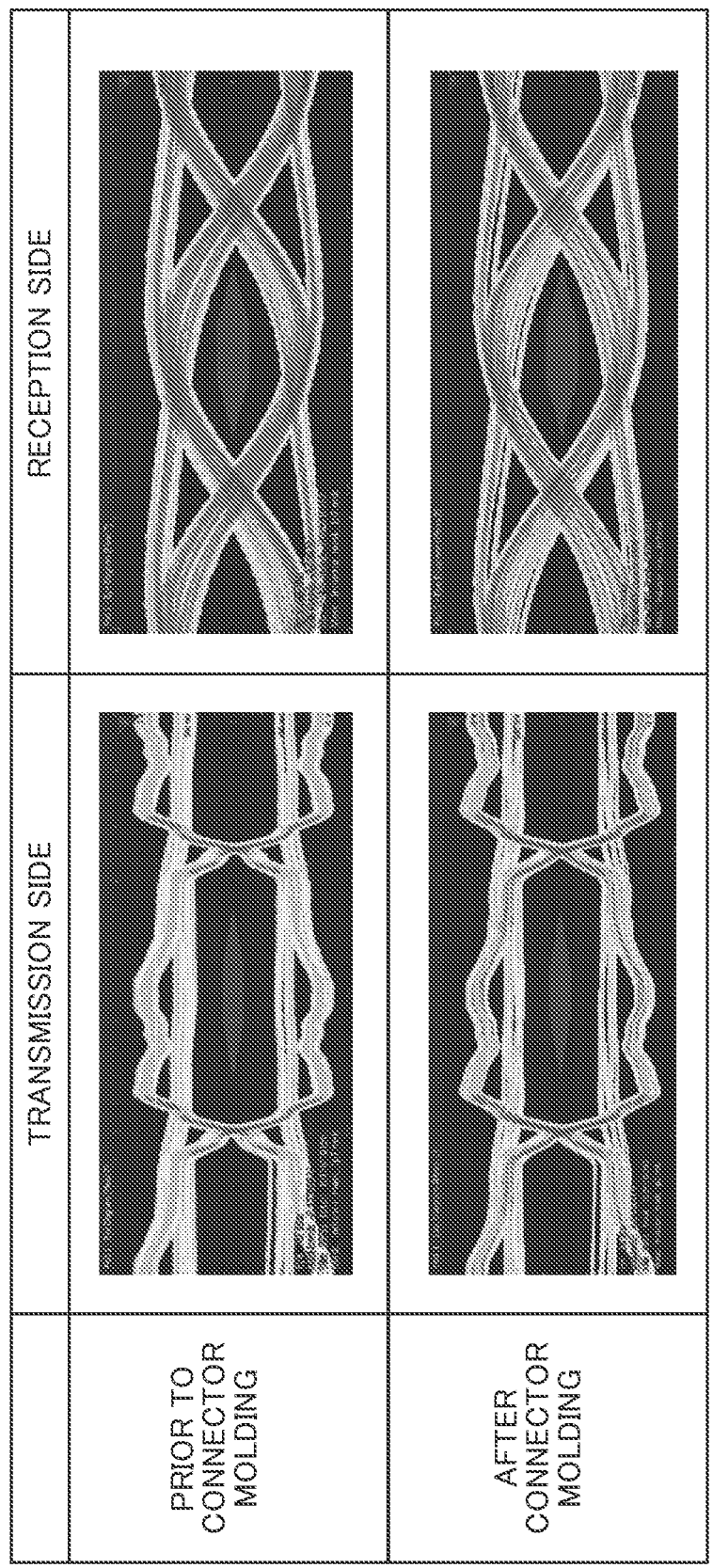
FIG. 10 is a diagram comparing eye patterns before and after insert molding.
Figure 11:
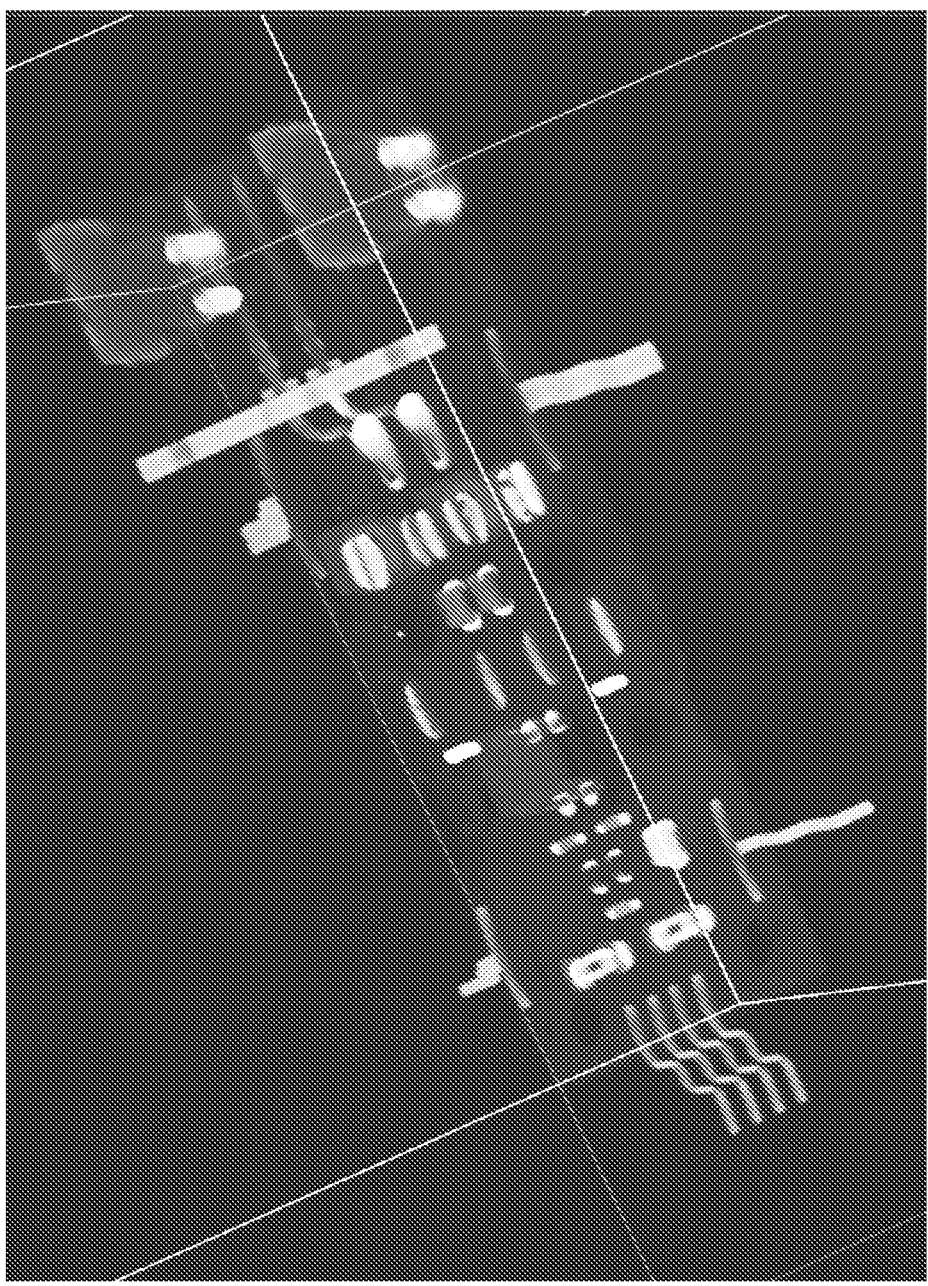
FIG. 11 is a soft X-ray photograph of a connector after insert molding.

Results are illustrated in FIG. 10 and FIG. 11.

FIG. 10 is a diagram comparing eye patterns before and after insert molding. As is apparent from FIG. 10, there is no large change in eye pattern between before and after insert molding, and no issue occurs at the soldering portions of connection locations between the internal board 20 and the electrical components 21 and the like.

FIG. 11 is a soft X-ray photograph of the connector after insert molding. It is also apparent from the soft X-ray photograph that no issue occurs at the solder attachment portions of connection locations between the internal board 20 and the electrical components 21 and the like.

From the above results it is apparent that no issue occurs at the soldering portions even when a resin having a melting temperature at least 60° C. higher than the melting temperature of the solder for bonding the electrical components 21 and the internal connector 50 to the internal board 20 is employed as the resin for configuring the resin section 60.

Moreover, although it might be said that issues are not liable to occur at soldering portions in cases in which the volume of the resin for configuring the resin section 60 is small (for example, about 500 mm$^3$), due to a short filling time being sufficient, it is apparent from the above results that no issue occurs at the solder attachment portions even in cases in which the volume of the resin for configuring the resin section 60 exceeds 1000 mm$^3$ (and furthermore in cases in which 1500 mm$^3$ is exceeded). Note that in the electrical device 10 according to the present exemplary embodiment, there is a limit to how small the volume of the resin section 60 can be due to the resin section 60 needing to retain the internal connector 50 and the internal board 20 formed with the filter circuit.

Operation and Advantageous Effects

Next, description follows regarding operation and advantageous effects of the present exemplary embodiment.

In the present exemplary embodiment, as illustrated in FIG. 1 and FIG. 3, the electrical device 10 includes the internal board 20, the terminals 30, 40A, 40B connected to the internal board 20, and the resin section 60 that retains the internal board 20 and the terminals 30, 40A, 40B. The resin section 60 is formed by insert molding with the internal board 20 and the terminals 30, 40A, 40B as inserts, and the electrical device 10 has high water proofing, dust proofing, and anti-vibration characteristics.

Figure 5:
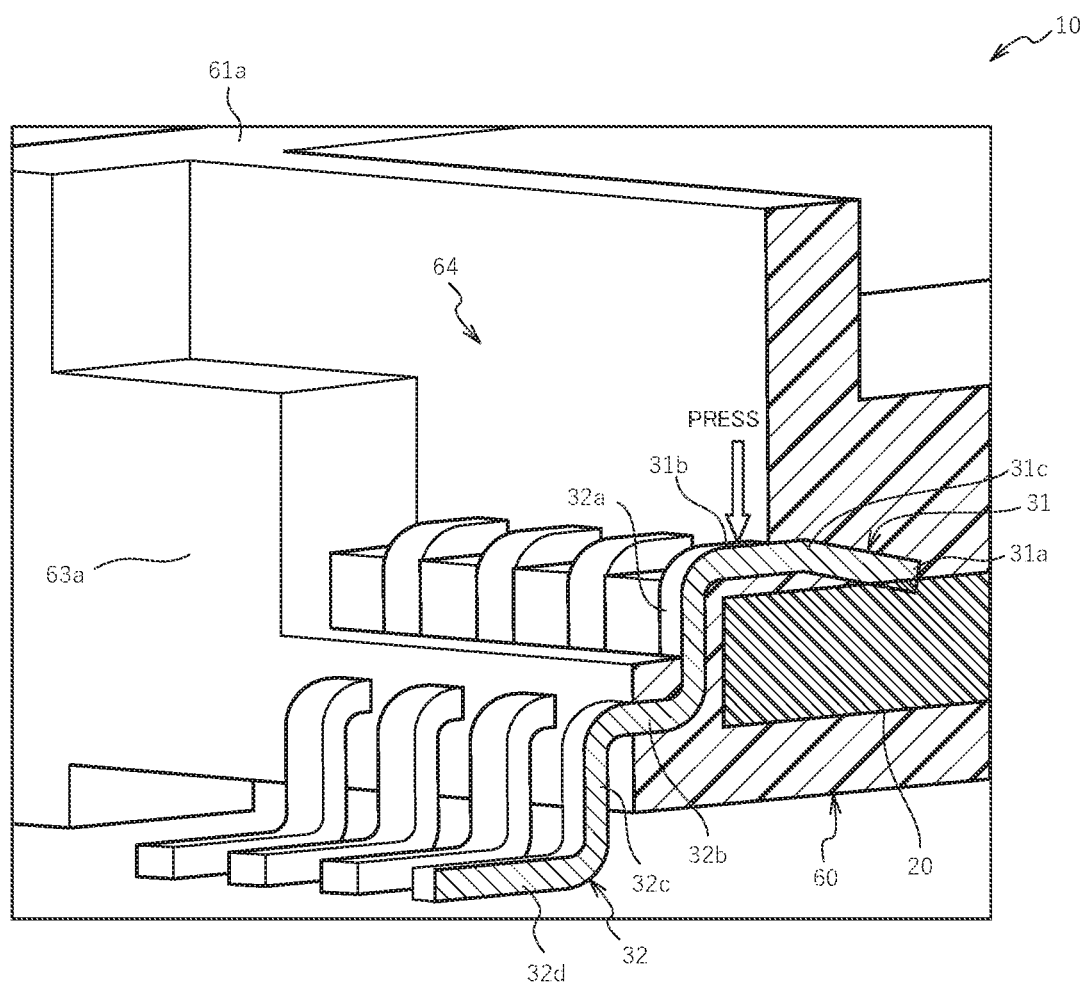
FIG. 5 is a cross-section illustrating an enlargement of the vicinity of a first terminal of a connector.

As illustrated in FIG. 5 and the like, connection of the terminals 30, 40A, 40B to the internal board 20 is implemented by the resin section 60 retaining the internal board 20 and the terminals 30, 40A, 40B so as to maintain a state of contact of the terminals 30, 40A, 40B against the internal board 20. There is no bonding material other than the resin for configuring the resin section 60 (i.e. no solder, adhesive, or the like) disposed at the connection locations of the terminals 30, 40A, 40B to the internal board 20.

This accordingly raises the productivity in the following manner.

Namely, hitherto in an electrical device, terminals are attached to a board by soldering in advance prior to forming a resin section by insert molding, and so sometimes the board and the terminals are difficult to dispose in the mold for insert molding due to misalignment of the attachment positions of the terminal with respect to the board, with this having an adverse effect on productivity.

In contrast thereto, in the electrical device 10 according to the present exemplary embodiment, there is no bonding material other than the resin for configuring the resin section 60 disposed at the connection locations of the terminals 30, 40A, 40B with respect to the internal board 20, and so a process for attaching the terminals 30, 40A, 40B to the internal board 20 using soldering or the like prior to forming the resin section 60 can be omitted. Placing the internal board 20 and the terminals 30, 40A, 40B in the mold for insert molding is facilitated due to omitting such a processes, and productivity is improved as a result.

Moreover, in the present exemplary embodiment the terminals 30, 40A, 40B include the contact portions 31a, 41a that contact the internal board 20. As illustrated in FIG. 5 and the like, the terminals 30, 40A, 40B are retained by the resin section 60 in a state in which the contact portions 31a, 41a are pressed against the internal board 20 by recovery force arising from resilient deformation of the terminals 30, 40A, 40B.

The insert molding can accordingly be performed while a state is maintained in which the contact portions 31a, 41a of the terminals 30, 40A, 40B are being pressed against the internal board 20 by the recovery force to resilient deformation of the terminals 30, 40A, 40B. This results in a good connection state between the terminals 30, 40A, 40B and the internal board 20 in the finished product of the electrical device 10.

Moreover, in the present exemplary embodiment the terminals 30, 40A, 40B include the contact portions 31a, 41a that contact the internal board 20, and the press portions 31b, 41b that are exposed from the resin section 60 and accordingly can be pressed during insert molding. The press portions 31b, 41b are formed at positions where the contact portions 31a, 41a can be pressed against the internal board 20 by the press portions 31b, 41b being pressed during insert molding.

This thereby enables insert molding to be performed while a state in which the contact portions 31a, 41a of the terminals 30, 40A, 40B are pressed against the internal board 20 is being maintained by pressing from the press portions 31b, 41b. This results in a good connection state between the terminals 30, 40A, 40B and the internal board 20 in the finished product of the electrical device 10.

Moreover as illustrated in FIG. 6, FIG. 7A, FIG. 7B, in the present exemplary embodiment the contact portions 31a, 41a and the press portions 31b, 41b are formed at positions distanced from each other. The portions between the contact portions 31a, 41a and the press portions 31b, 41b (the resilient portions 31c, 41c) resiliently deform, and the terminals 30, 40A, 40B are retained by the resin section 60 in a state in which the contact portions 31a, 41a are pressed against the internal board 20 by recovery force to this resilient deformation.

This thereby eliminates a need to directly hold the contact portions 31a, 41a in place during insert molding, enables the contact portions 31a, 41a to be pressed against the internal board 20 with an appropriate force, and enables the damage to the contact portions 31a, 41a or the internal board 20 to be suppressed from occurring. Furthermore, due to this the contact portions 31a, 41a can be buried entirely in the resin section 60, and a good contact state is maintained between the internal board 20 and the terminals 30, 40A, 40B.

Moreover, in the present exemplary embodiment, the internal board 20 and the resin section 60 both have shapes that are elongated in the same direction. The first terminals 30 are disposed in the vicinity of the front edge 20a at a length direction one end side of the internal board 20, and gate marks 60g of the resin section 60 (see FIG. 1) are formed at positions at the length direction other end side of the resin section 60.

This means that the terminals 30 are arranged at positions distanced from the gates where molten resin flows in at high pressure, enabling unintentional deformation of the terminals 30 by the molten resin (for example, deformation of the terminals 30 such that the terminals 30 come away from the internal board 20) to be suppressed from occurring.

Figure 4:
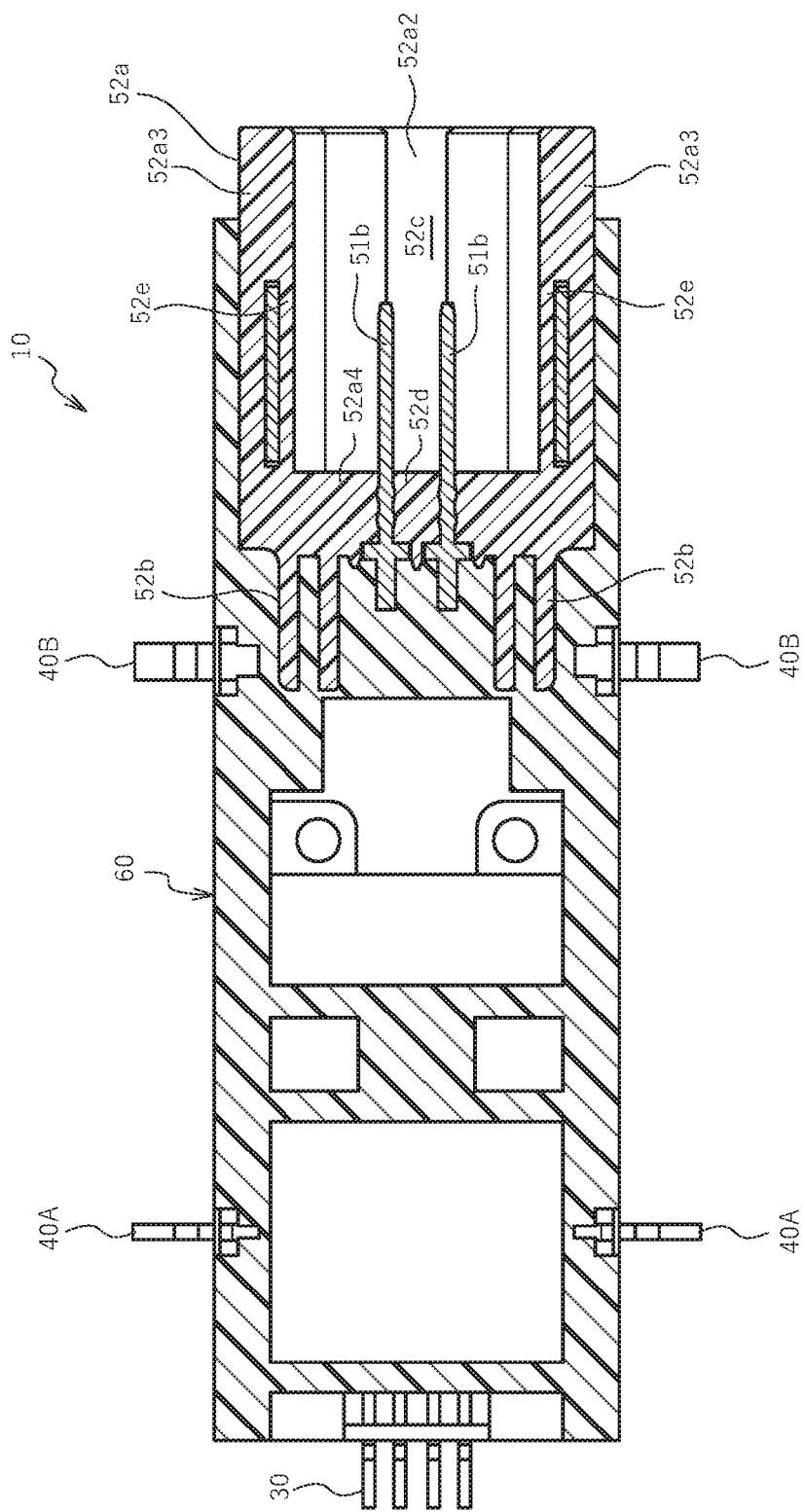
FIG. 4 is a cross-section of a connector sectioned along a plane perpendicular to an up-down direction.

Moreover as illustrated in FIG. 4, in the exemplary embodiment the electrical device 10 includes the impact portions 52a3 impacted by the molten resin. The gate marks 60g of the resin section 60 (see FIG. 1) are formed at positions facing the impact portions 52a3, and so the force of the molten resin injected at high pressure during insert molding is weakened by impact with the impact portions 52a3. This thereby enables the terminals 30, 40A, 40B to be suppressed from being pulled away from the internal board 20 by the molten resin impacting the terminals 30, 40A, 40B with a high force.

Moreover, in the present exemplary embodiment the impact portions 52a3 are formed to the housing 52, and so the housing 52 of the internal connector 50 can be effectively utilized.

Figure 17:
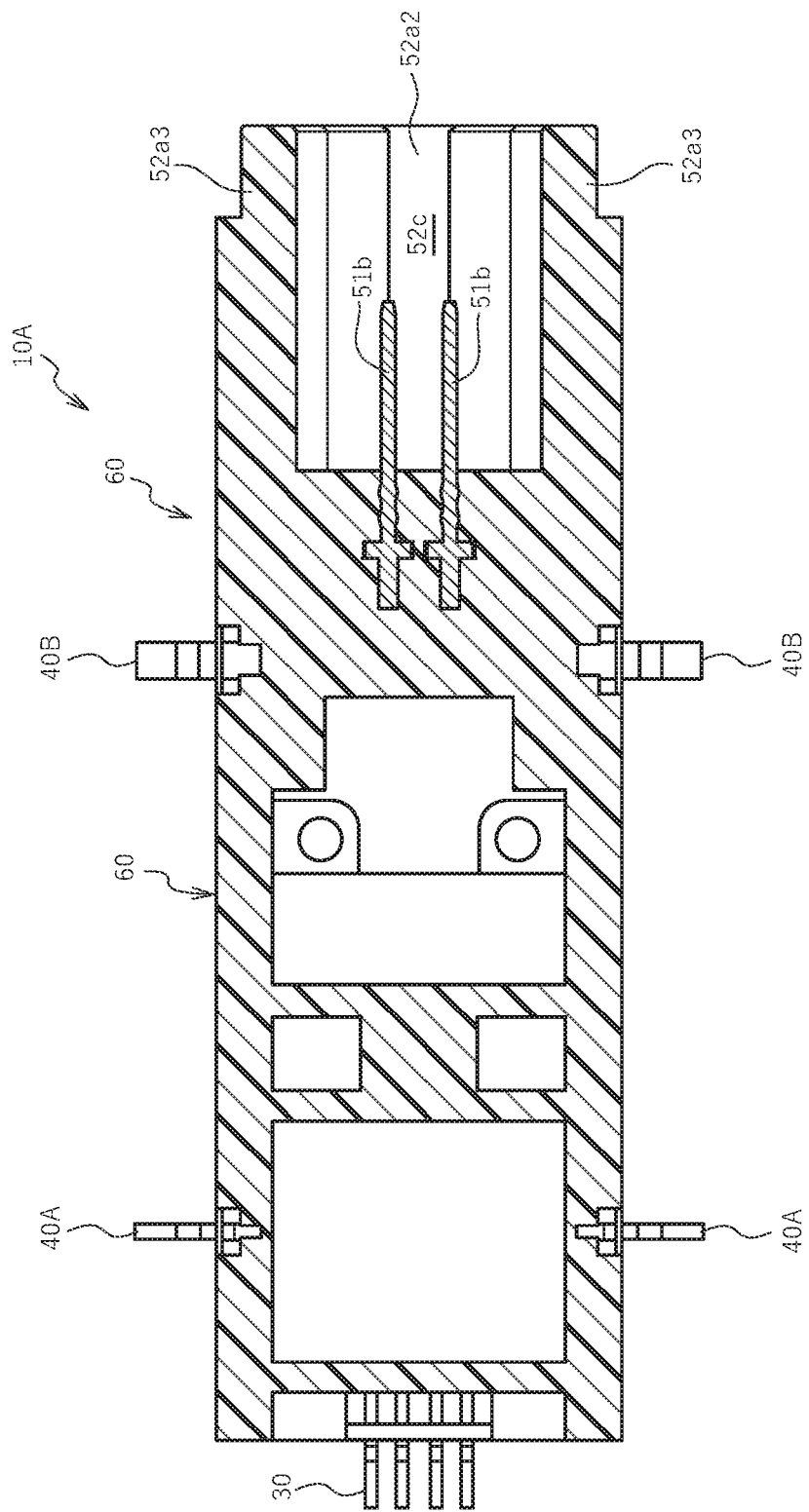
FIG. 17 is a cross-section corresponding to FIG. 4 and illustrating a modified example of a connector.

Note that as illustrated in FIG. 17, as a modified example of the present exemplary embodiment, the resin section 60 may include an impactor gap section 52c, and the gate marks 60g of the resin section 60 may be formed at positions facing the impactor gap section 52c. In such a modified example, a tool (die or the like) may be disposed in the position of the impactor gap section 52c during insert molding. Adopting such an approach means that the force of the molten resin flowing in under high pressure is weakened by impact with the tool. This thereby enables the terminals 30, 40A, 40B to be suppressed from being pulled away from the internal board 20 by the molten resin impacting the terminals 30, 40A, 40B with a high force.

In the illustrated example the indentation 52c having the external side contact portions 51b of the internal terminal 51 disposed therein is illustrated as an example in which there is an impactor gap section 52c, however an impactor gap section is not limited thereto.

Moreover as illustrated in FIG. 15, in the present exemplary embodiment the support section 71 has a frame shape and so the support section 71 is not liable to flex, thereby facilitating setting the terminal portions 30, 40A, 40B (terminals) at appropriate positions in the mold.

Moreover, in the present exemplary embodiment the resin for configuring the resin section 60 is a thermoplastic resin. This thereby enables the molding time of insert molding to be shortened, productivity to be improved, and generation of resin burrs to be suppressed compared to cases in which the resin for configuring the resin section 60 is a thermoset resin.

Moreover, the melting temperature of the resin for configuring the resin section 60 in the present exemplary embodiment is higher than the melting temperature of the solder for bonding the electrical components 21 to the internal board 20. This thereby facilitates use of a resin having a high melting temperature and facilitates use of a solder having a low melting point compared to cases in which the melting temperature of the resin is lower than the melting temperature of the solder. Utilizing a resin having a high melting temperature enables the heat resistance of the electrical device 10 to be raised, and when a low melting point solder is used deterioration of the electrical components 21 due to heat during soldering can be prevented from occurring. The electrical device 10 according to the present exemplary embodiment is accordingly one with raised heat resistance and one in which deterioration of the electrical components 21 is prevented.

Furthermore, in the present exemplary embodiment the melting temperature of the resin for configuring the resin section 60 is at least 60° C. higher than the melting temperature of the solder for bonding the electrical components 21 to the internal board 20.

This means that the electrical device 10 according to the present exemplary embodiment is accordingly one with heat resistance raised even more and in which deterioration of the electrical components 21 is prevented even further.

Moreover, the melting temperature of the resin for configuring the resin section 60 in the present exemplary embodiment is at least 270° C. This thereby enables the electrical device 10 to be attached to an attachment target by, for example, reflow soldering in an environment of about 250° C.

Moreover, in the present exemplary embodiment the housing 52 is formed separately to the resin section 60, facilitating freedom in forming the shape of the housing 52. Namely, this makes it easy to form the housing 52 in a shape not able to be formed by insert molding, or a shape that would be difficult to form thereby.

Note that as a modified example of the present exemplary embodiment, the housing 52 may be formed by insert molding at the same time as the resin section. In such a modified example, a separate process to form the housing 52 can be eliminated and productivity is better than in an embodiment in which the housing 52 is formed separately to the resin section 60.

Supplementary Explanation of Above Exemplary Embodiment

Note that in the above exemplary embodiment an example was described in which the electrical device is the filter circuit in-built connector 10. However, the electrical device of the present disclosure is not limited thereto, and application may be made to a connector lacking an in-built filter circuit, and application may be made to an electrical device other than a connector.

Moreover, although in the exemplary embodiment an example was described in which a filter circuit was formed on the internal board 20, the internal board of the present disclosure is not limited thereto.

EXPLANATION OF THE REFERENCE NUMERALS 10 filter circuit in-built connector (connector, electrical device)
20 internal board (board)
20a front edge (edge at length direction one end side of board)
21 electrical component
30 first terminal (terminal)
31a internal side connection portion (contact portion)
31b press portion
31c resilient portion
32d external side connection portion
40A second terminal (side terminal, terminal)
40B third terminal (side terminal, terminal)
41a internal side connection portion (contact portion)
41b press portion
41c resilient portion
42 external side extension section
50 internal connector (connector section)
51 internal terminal
52 internal housing (housing)
52a3 side wall (impact portion)
52c indentation (impactor gap section)
60 resin section
60g gate mark
70 insert metal member (metal member)
71 support section

The invention claimed is:

1. An electrical device, comprising: a board; an electrical component bonded to the board by soldering; and a resin section that retains the board and the electrical component, the resin section in direct contact with the electrical component, wherein, in the electrical device: the resin section is formed by insert molding with the board and the electrical component as inserts; a resin for configuring the resin section is a thermoplastic resin; and a melting temperature of the resin for configuring the resin section is higher than a melting temperature of a solder for bonding the electrical component to the board.

2. The electrical device of claim 1, wherein the melting temperature of the resin for configuring the resin section is at least 60° C. higher than the melting temperature of the solder for bonding the electrical component to the board.

3. The electrical device of claim 1, wherein:
   the electrical device is employed by being attached to an attachment target;
   the electrical device further includes a terminal;
   the terminal includes a connection portion that is surface mountable to an attachment surface of the attachment target; and
   the melting temperature of the resin for configuring the resin section is at least 270° C.

4. The electrical device of claim 1, wherein the electrical device further includes:
   a terminal that is connected to the board and that is connectable to an attachment target; and
   a connector section that is connected to the board and that is connectable to an external connector.

5. The electrical device of claim 4, wherein:
   the connector section includes an external side terminal and a housing to retain the external side terminal; and
   the housing is formed separately to the resin section.

6. The electrical device of claim 4, wherein:
   the connector section includes an external side terminal and a housing to retain the external side terminal; and
   the housing is formed by insert molding at the same time as the resin section.

* * * * *